(12) United States Patent
Lu et al.

(10) Patent No.: US 12,379,695 B2
(45) Date of Patent: Aug. 5, 2025

(54) TIME-TO-DIGITAL CONVERTERS (TDC) EMPLOYING A SINGLE-STAGE DELAY PAIR AND NOISE SHAPING FOR WIDE INPUT RANGE AND REDUCED QUANTIZATION NOISE IN A PHASE-LOCKED LOOP (PLL)

(71) Applicant: Microsoft Technology Licensing, LLC, Redmond, WA (US)

(72) Inventors: Ping Lu, Cary, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 201 days.

(21) Appl. No.: 18/141,342

(22) Filed: Apr. 28, 2023

(65) Prior Publication Data

US 2024/0361729 A1 Oct. 31, 2024

(51) Int. Cl.
*H03M 1/50* (2006.01)
*G04F 10/00* (2006.01)
*H03L 7/085* (2006.01)

(52) U.S. Cl.
CPC ............ *G04F 10/005* (2013.01); *H03L 7/085* (2013.01)

(58) Field of Classification Search
CPC ...... G04F 10/005; G04F 10/10; G04F 10/105; H03M 1/50; H03M 1/60; H03M 1/68
USPC .................. 341/155, 120, 118, 111
See application file for complete search history.

(56) References Cited

U.S. PATENT DOCUMENTS

| | | | | |
|---|---|---|---|---|
| 11,619,914 B2* | 4/2023 | Myers | ..................... | H03L 7/085 |
| | | | | 327/158 |
| 2007/0110194 A1* | 5/2007 | de Obaldia | ............. | H03L 7/091 |
| | | | | 375/345 |
| 2008/0068236 A1* | 3/2008 | Sheba | ................... | G04F 10/005 |
| | | | | 341/131 |

OTHER PUBLICATIONS

International Search Report and Written Opinion received for PCT Application No. PCT/US2024/024539, (MS# 412838-PCT01) mailed on Aug. 2, 2024, 14 pages.
Lu, et al., "An adaptive wide-range Time-to-Digital Converter with flexible resolution for DPLL applications", IEEE 65th International Midwest Symposium on Circuits and Systems, Aug. 7, 2022, 4 pages.

* cited by examiner

*Primary Examiner* — Peguy Jean Pierre
(74) *Attorney, Agent, or Firm* — Novo TechIP International PLLC

(57) ABSTRACT

Time-to-digital converters (TDC) employing a single-stage delay pair for a wide input range and reduced quantization noise in a phase-locked loop (PLL) and related fabrication methods are disclosed. Aspects disclosed in the detailed description include a single-stage Vernier time-to-digital converter (TDC) which mitigates the device mismatch impact and therefore avoids possible spurious tones in a fractional-N PLL application. Combined with a delta-sigma noise shaping stage and a ring-oscillator based coarse TDC, the invention achieves a good trade-off between resolution, detection range and PLL locking speed.

21 Claims, 11 Drawing Sheets

TIME-TO-DIGITAL CONVERTERS (TDC) EMPLOYING A SINGLE-STAGE DELAY PAIR AND NOISE SHAPING FOR WIDE INPUT RANGE AND REDUCED QUANTIZATION NOISE IN A PHASE-LOCKED LOOP (PLL)

BACKGROUND

I. Field of the Disclosure

The technology of the disclosure relates generally to phase-locked loops and, more particularly, to time-to-digital converters that provide fast locking and low noise.

II. Background

Phase-locked-loop (PLLs) are widely used to generate signals that consistently oscillate at a desired frequency and with as little noise as possible. For example, PLLs may be employed to generate carrier signals for wired or wireless communication or system clocks for clocking digital logic in integrated circuits. As the feature sizes made possible by improvements in integrated circuit (IC) fabrication have become smaller, there are increased benefits to using digital PLLs (DPLLs). One of the components in a DPLL that can significantly affect the quality of the generated output signal is the time-to-digital converter (TDC) circuit. In a PLL, the TDC circuit receives two signals (e.g., rising edges) that are separated by a time period related to a phase difference between a generated output signal and a reference signal. The TDC circuit converts the time period to an integer number that is used to adjust control of a digitally controlled oscillator, which generates the output signal.

Since the objective of the DPLL is to keep the phase of the output signal consistently close to the phase of the reference signal, it is preferable to measure that time difference in fine increments (e.g., with higher resolution) to detect smaller changes. On the other hand, when the power is initially turned on to the DPLL, the phases of the output signal and the reference signal may be far apart. Measuring a large amount of time in very small increments can require a significant amount of circuitry, which occupies area and consumes power on an IC. If the DPLL cannot determine the phase difference between the output signal and the reference signal, it can take much longer to synchronize the output signal to the reference signal at power on. Therefore, in this regard, increasing the size of increments of time measurement is preferable so the circuitry can be reduced.

A conventional Vernier TDC measures the time difference using two strings of delay circuits, but the number of stages needed for a given input range increases with the resolution. Also, if the delays of the delay stages are inconsistent due to process variations, for example, noise (e.g., spurious tones) may be generated on the output signal. Another option to reduce the number of circuits and avoid inconsistent delays is a single-stage Vernier TDC, which includes single delay stages used in a feedback method. However, the delay time of the single-stage delay affects both the input range and the resolution of the TDC circuit, which are conflicting requirements. Thus, a TDC circuit having a wide detection range without sacrificing resolution is desired.

SUMMARY

Aspects disclosed in the detailed description include a single-stage Vernier time-to-digital converter (TDC) for a wide input range and reduced quantization noise in a phase-locked loop (PLL). Methods of a fast-locking DPLL with low spurious tones are also disclosed.

A TDC circuit is critical to the ability of a PLL to closely track a reference signal. A Vernier TDC is a well-known design that requires long chains of delay circuits, which occupy area, consume power, and may cause noise in the output signal due to inconsistent delays. A single-stage pair TDC employs the concept of a Vernier TDC but uses a single-stage delay pair in a feedback loop to reduce circuitry and avoid inconsistent delays. Because a TDC measures time periods in increments having a certain resolution, there is necessarily a residual portion (e.g., time remainder) that cannot be reflected in the integer number generated by the TDC. In an exemplary TDC circuit, a first measurement circuit determines an integer number of time increments in a time period and a remainder, and a second measurement circuit generates a fractional indicator, indicating whether an accumulation of the time remainder and previous time remainders exceeds an integer time increment. In some examples, the fractional indicator may be used in a PLL to increase the resolution of the TDC, providing more frequent and finer adjustments to a digitally controlled oscillator (DCO). In this manner, the TDC circuit may have a wider range of detection while pushing the quantization noise to a higher frequency range, where it can be filtered by the PLL.

In this regard, a time-to-digital converter (TDC) circuit is disclosed. The TDC circuit includes a first measurement circuit configured to receive a start pulse signal and a stop pulse signal separated in time by a time period, determine an integer number of consecutive first time increments in the time period, and determine a time remainder of the time period smaller than the first time increment (step). The TDC circuit further includes a second measurement circuit configured to add the time remainder to a previously accumulated remainder to generate a current accumulated remainder and generate a fractional indicator indicating whether a magnitude of the current accumulated remainder (positive or negative) is greater than half of the first time increment (step). Further, in response to the fractional indicator indicating the magnitude of the current accumulated remainder is greater than half of the first time increment, generate a next accumulated remainder comprising a difference between the first time increment and the current accumulated remainder and in response to the fractional indicator indicating the magnitude of the current accumulated remainder is less than half of the first time increment, generate the next accumulated remainder comprising the current accumulated remainder.

In another aspect, a method of a TDC circuit is disclosed. The method includes receiving a start pulse signal and a stop pulse signal separated in time by a time period, determining an integer number of a first time increment and a time remainder smaller than the first time increment within the time period, adding the time remainder to a previously accumulated remainder to generate a current accumulated remainder, and generating a fractional indicator indicating whether the current accumulated remainder differs from the first time increment by more than half of the first time increment. The method further includes in response the fractional indicator indicating the current accumulated remainder differs from the first time increment by more than half of the first time increment, generating a next accumulated remainder comprising a difference between the first time increment and the current accumulated remainder, and in response the fractional indicator indicating the current accumulated remainder differs from the first time increment by less than half of the first time increment, generating the next accumulated remainder based on the current accumulated remainder.

In another aspect, a phase-locked loop (PLL) circuit is disclosed. The PLL circuit includes a digitally controlled oscillator (DCO), a loop filter circuit, a divider circuit, and a time-to-digital (TDC) system. The TDC system includes a coarse TDC circuit and a fine TDC circuit. The fine TDC circuit includes a first measurement circuit configured to receive a start pulse signal and a stop pulse signal separated in time by a time period, determine an integer number of consecutive first time increments in the time period, and determine a time remainder of the time period smaller than one of the first time increments. The fine TDC circuit further includes a second measurement circuit configured to add the time remainder to a previously accumulated remainder to generate a current accumulated remainder, generate a fractional indicator indicating whether a magnitude of the current accumulated remainder is greater than half of the first time increment, and in response to the fractional indicator indicating the magnitude of the current accumulated remainder is greater than half of the first time increment, generate a next accumulated remainder comprising a difference between the first time increment and the current accumulated remainder, and in response to the fractional indicator indicating the magnitude of the current accumulated remainder is less than half of the first time increment, generate the next accumulated remainder comprising the current accumulated remainder. The PLL circuit further includes a range determination circuit configured to determine whether the duration of the time period is within a time period range and, in response to determining the duration of the time period is greater than a maximum time period in the time period range, generate the integer number corresponding to the duration of the time period in the coarse TDC circuit, and in response to determining the duration of the time period is within the time period range, generate the integer number corresponding to the duration of the time period in the fine TDC.

DETAILED DESCRIPTION

Figure 1:
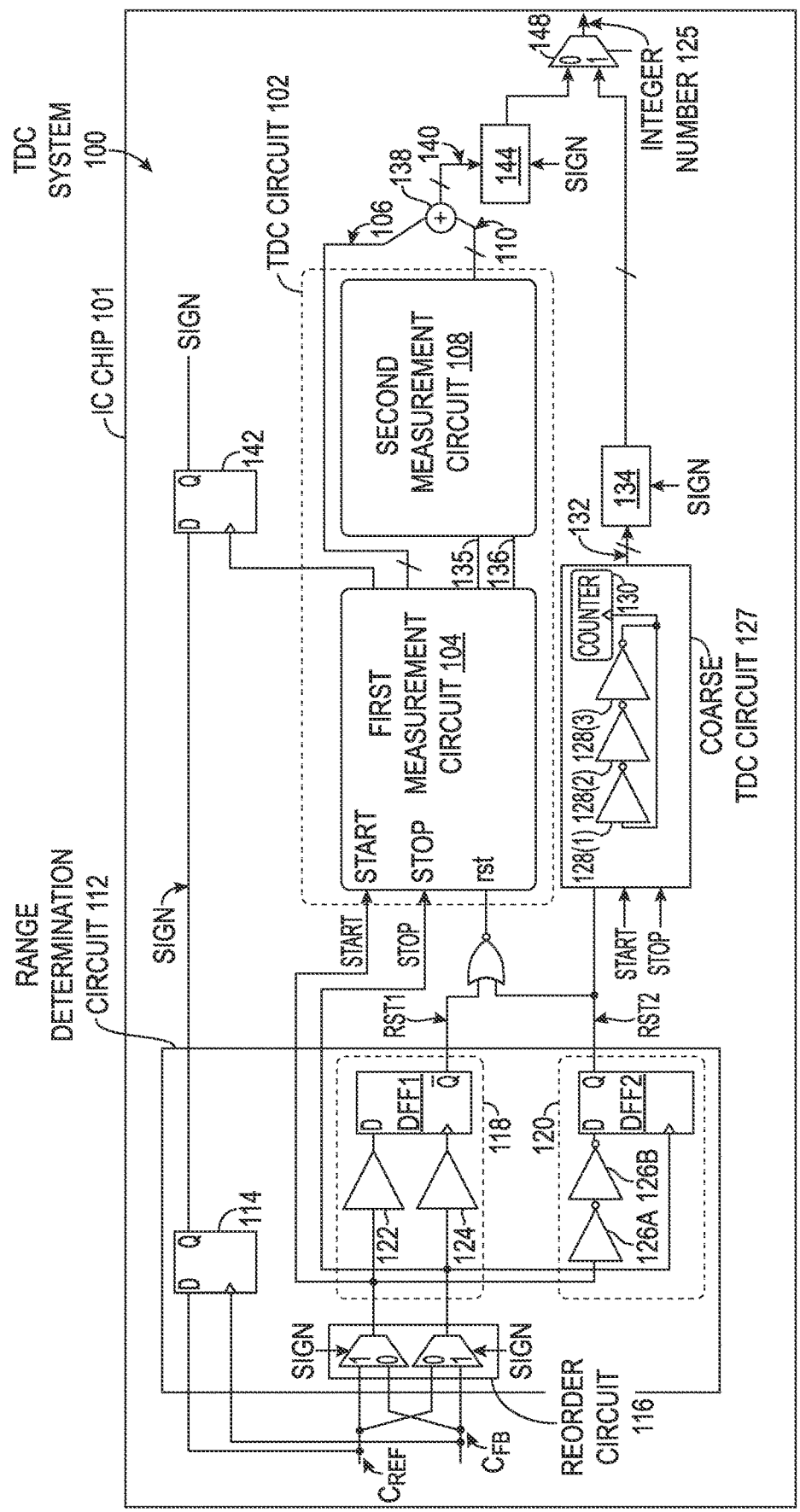
FIG. 1 is a block diagram of an exemplary time-to-digital (TDC) system, including an exemplary TDC circuit having a first measurement circuit to determine a number of time increments in a time period and a second measurement circuit that accumulates remainders and generates an indicator of a fraction of a time increment to reduce quantization noise in a PLL.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a single-stage Vernier time-to-digital converter (TDC) for a wide input range and reduced quantization noise in a phase-locked loop (PLL). Methods of a fast-locking DPLL with low spurious tones are also disclosed.

In this regard, FIG. 1 is a block diagram of an exemplary time-to-digital (TDC) system 100 in an integrated circuit chip 101, including an exemplary TDC circuit 102 having a first measurement circuit 104 to determine an integer number 106 indicating an integer number of time increments TI in a time period TP between a start pulse signal START and a stop pulse signal STOP. The time period TP between start pulse signal START and the stop pulse signal STOP is equal to the time period TP between the reference clock $C_{REF}$ and the feedback clock $C_{FB}$. However, as explained below, the start pulse signal START will lead the stop pulse signal STOP even though the reference clock $C_{REF}$ may either lead or lag the feedback clock $C_{FB}$.

The first measurement circuit 104 generates a time remainder TR that is a remaining portion of the time period TP, and the time remainder TR is smaller than the time increment TI. In an example TP=N(TI)+TR, where N is the integer number 106. The time remainder TR is sometimes referred to as a residual time. The TDC circuit 102 also includes a second measurement circuit 108 that generates a fractional indicator 110 based on a sum of the time remainder TR and a previously accumulated remainder PAR (not shown here) to indicate whether a current accumulated remainder CAR (not shown) exceed a fraction of the time increment TI.

Before describing the TDC system 100 in FIG. 1 in further detail, an example of a phase-locked loop (PLL) 200 in which the TDC system 100 may be employed is first described with reference to FIG. 2. The first measurement circuit 104 and the second measurement circuit 108 of the TDC circuit 102 are described in further detail with reference to FIGS. 4-7.

Figure 2:
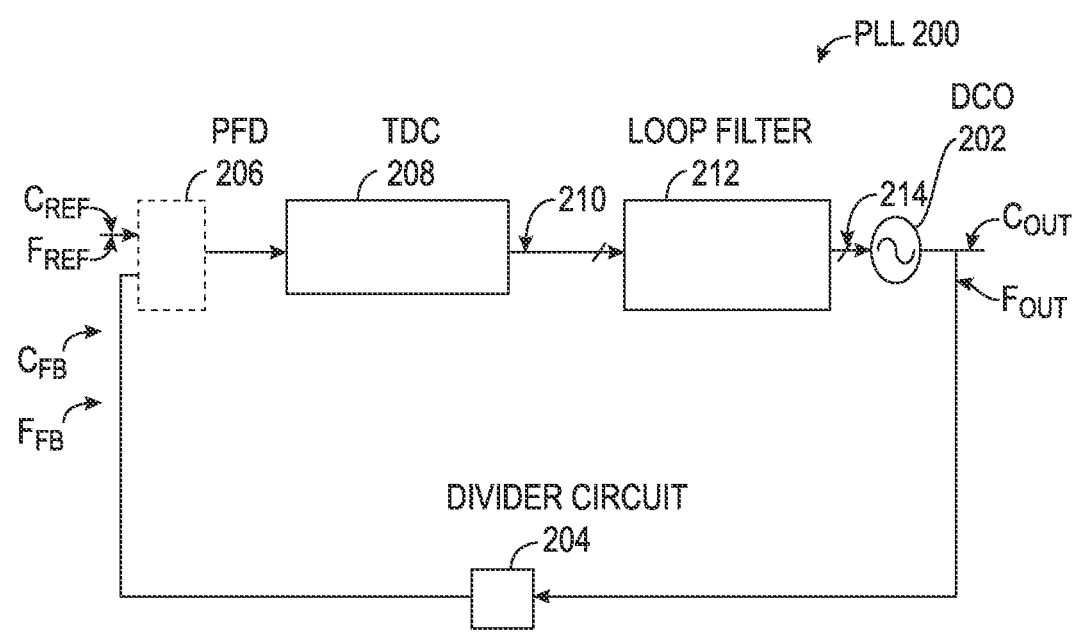
FIG. 2 is a block diagram illustrating an example of a phase-locked loop (PLL), including the exemplary TDC circuit of FIG. 1, having a first measurement circuit to determine a number of time increments in a time period and a second measurement circuit that accumulates remainders and generates an indicator of a fraction of a time increment to reduce quantization noise in a PLL.

The PLL 200 in FIG. 2 is an example in which the TDC system 100, including the TDC circuit 102, may be employed. The PLL 200 includes a digitally controlled oscillator (DCO) 202 that generates an output clock signal $C_{OUT}$ that oscillates at an output frequency $F_{OUT}$. The output clock signal $C_{OUT}$ may be a carrier signal for wired or wireless communication or may be a system clock in digital logic circuits of the IC chip 101, for example. For such applications, it is desirable for the output clock signal $C_{OUT}$ to have consistent phase and frequency, with a minimum of noise. To improve phase and frequency consistency, the PLL 200 receives a reference clock signal $C_{REF}$ which may be, for example, from a crystal oscillator or other reliable, consistent source for comparison to the output clock signal $C_{OUT}$. The output frequency Four may differ from a reference frequency FREF of the reference clock signal $C_{REF}$. For example, the output frequency Four may be a multiple X of the reference frequency FREF. The PLL 200 includes a divider circuit 204 that divides the output frequency Four of the output clock signal $C_{OUT}$ by X to produce a feedback clock signal $C_{FB}$ having a feedback frequency $F_{FB}$ for comparison to the reference clock signal $C_{REF}$.

In some examples, the multiple X is a non-integer, but the divider circuit 204 may be a multi-modulus divider (MMD) that is only capable of division by an integer. The mismatch between X and a nearest integer creates significant noise in the output clock signal $C_{OUT}$, so a dithering circuit (not shown) may be used to toggle an integer divisor of the divider circuit 204 between two or more integer values (e.g., between 10 and 11 for an average of 10.65) to obtain an average of the non-integer multiple. This type of dithering circuit increases frequency accuracy compared to a PLL without the dithering circuit but continues to generate noise on the output clock signal $C_{OUT}$. A PLL that also includes the TDC system 100 and TDC circuit 102 in FIG. 1, with or without a dithering circuit coupled to the divider circuit, reduces noise on the output clock signal $C_{OUT}$ by pushing the quantization noise out of the PLL bandwidth where it can be effectively filtered.

With further reference to FIG. 2, the PLL 200 may receive the reference clock signal $C_{REF}$ and the feedback clock signal $C_{FB}$ directly from the divider circuit 204 as the start pulse signal START and a stop pulse signal STOP. In some examples, the PLL 200 includes a phase-frequency detector (PFD) 206 in addition to a TDC 208. The TDC 208 may be the TDC system 100 in FIG. 1, including the TDC circuit 102. In examples including the PFD 206, the PFD 206 receives the reference clock signal $C_{REF}$ and the feedback clock signal $C_{FB}$, compares the phase of the feedback clock signal $C_{FB}$ to the phase of the reference clock signal $C_{REF}$ and generates a start pulse signal START and a stop pulse signal STOP that indicate the phase difference as a time period TP. As an example, the PFD 206 generates the start pulse signal START as a pulse (e.g., step in voltage) with a leading edge and the stop pulse signal STOP with a leading edge such that the leading edges are separated in time by the time period TP corresponding to the phase difference. The TDC 208 generates an integer number 210, which is a quantification of the time period TP. The integer number 210 indicates a number of time increments in the time period TP and may be positive or negative. The integer number 210 may change in every cycle of the reference clock signal $C_{REF}$ and is filtered by a loop filter 212. The loop filter 212 provides a filtered control signal 214 to the DCO 202 to control the frequency Four of the output clock $C_{OUT}$. The integer number 210 is based on a time/phase offset of the feedback clock $C_{FB}$ relative to the reference clock $C_{REF}$ and is employed by the DCO 202 to bring the phases closer together, eventually achieving a "lock state" in which the phases of the reference clock signal $C_{REF}$ and the feedback clock signal $C_{FB}$ are the same or kept within a small (e.g., undetectable) margin of phase difference.

Returning to FIG. 1, the TDC system 100 includes a range determination circuit 112 that receives the reference clock $C_{REF}$ and the feedback clock $C_{FB}$, which are separated by the time period TP. The range determination circuit 112 determines a sign of the time period TP in a sign detection circuit 114 and determines whether a duration of the time period TP is within a time period range of the TDC circuit 102. If the feedback clock $C_{FB}$ is received at the TDC system 100 before the reference clock $C_{REF}$, the time period TP has a negative sign. If the reference clock $C_{REF}$ is received at the TDC system 100 before the reference clock $C_{REF}$, the time period TP has a positive sign. The sign detection circuit 114 generates a sign indicator SIGN indicating the sign or polarity of the time period TP. If the sign indicator SIGN is positive, the start pulse signal START is based on the reference clock $C_{REF}$ and the stop pulse signal STOP is based on the feedback clock $C_{FB}$. On the other hand, in instances in which the sign indicator SIGN is negative, a reorder circuit 116 in the range determination circuit 112 generates the start pulse signal START from the reference clock $C_{REF}$ and generates the stop pulse signal STOP from the feedback clock $C_{FB}$. In this manner, the start pulse signal START will arrive at the first measurement circuit 104 before the stop pulse signal STOP, independent of the sign indicator SIGN.

The range determination circuit 112 includes a low-limit detector 118 and a high-limit detector 120. The low-limit detector 118 determines whether the time period TP separating the start pulse signal START and the stop pulse signal STOP is less than the time increment resolution of the TDC circuit 102. If so, the low-limit detector 118 generates a signal RST1 to reset the TDC circuit 102 to prepare the TDC circuit 102 for a next start pulse signal START. In the example shown, the low-limit detector 118 sets a flip-flop circuit DFF1 to a low level if the time period TP is less than a minimum detectable time or resolution $T_{RES}$ of the TDC circuit 102. Specifically, if the stop pulse signal STOP propagates through a first delay circuit 122 having a first delay period ("first delay") T1 before the start pulse signal START propagates through a second delay circuit 124 having a second delay period ("second delay") T2, the flip-flop circuit DFF1 is set to the low level, causing the signal RST1 to be generated. Thus, $T_{RES}$=T1−T2. If the time period TP is shorter than the resolution $T_{RES}$, which occurs in the locked state, for example, the TDC system 100 does not make any adjustment to an integer number 125 provided to the loop filter 212 in FIG. 2. For example, if no adjustment is needed, the integer number 125 output from the TDC system 100 may be "0", indicating no positive or negative difference in phase between the output clock $C_{OUT}$ and the reference clock $C_{REF}$. It is noted that flip-flop circuits, which are edge triggered storage elements, are employed as opposed to latch circuits that are level sensitive. Flip-flops circuits (also referred to herein as "flip-flops") may also be known as data flip-flops or arbiter circuits.

The high-limit detector 120 determines whether the time period TP exceeds a maximum detection time of the TDC circuit 102, which corresponds to a maximum number of time increments TI that are detectable by the TDC circuit 102 in a time period TP. In this example, if the high-limit detector 120 determines that the time period TP exceeds a maximum detection time, a signal RST2 is generated to activate a coarse TDC circuit 127 and reset the TDC circuit 102 to prepare the TDC circuit 102 for a next start pulse signal START. In this case, if the stop pulse signal doesn't get to a flip-flop circuit DFF2 before the start pulse signal START propagates through delays 126A and 126B, the flip-flop circuit DFF2 generates the signal RST2. The coarse TDC circuit 127 may initially be activated immediately after power on, when the output clock $C_{OUT}$ and the reference clock $C_{REF}$ may be significantly out of phase. The coarse TDC circuit 127 is capable of measuring a much larger time period TP than the TDC circuit 102 but has a much coarser resolution. Relative to the coarse TDC circuit 127, the TDC circuit 102 may be referred to as a fine TDC circuit 102 because it measures the time period with higher resolution time increments TI.

As an example, the resolution of the coarse TDC circuit 127 may be determined by a loop of delay circuits 128(1)-128(3) (e.g., a ring oscillator), each having a delay T3. A counter 130 counts a number of times the start pulse signal START propagates through the loop of delay circuits 128(1)-128(3) before the stop pulse signal STOP is received. The coarse TDC circuit 127 generates an integer number 132, indicating the time period TP. A sign correction circuit 134 receives the sign indicator SIGN and converts the integer number 132 to a negative number if the sign indicator SIGN is negative. It should be understood that the integer number 132 generated by the coarse TDC circuit 127 may be consistent with the integer number 106 generated by the TDC circuit 102. In other words, the difference in resolution between the time increments TI of the TDC circuit 102 and the time measured by the loop of delay circuits 128 are accounted for in the generation of the integer numbers 106 and 132.

The first measurement circuit 104 provides the time remainder TR to the second measurement circuit 108 as a time difference between a pulse on a first remainder input 135 and a pulse on a second remainder input 136.

The TDC system 100 includes an adder 138 to add the integer number 106 generated by the first measurement circuit 104 and the fractional indicator 110 generated by the second measurement circuit 108 to generate a high-resolution integer number 140. A sign flip-flop circuit 142 stores the sign indicator SIGN until the TDC circuit 102 generates the integer number 106. A sign correction circuit 144 corrects the high-resolution integer number 140 if the SIGN generated in the sign flip-flop circuit 142 indicates the time remainder TR is negative. A selector circuit 148 selects one of the high-resolution integer number 140 from the TDC circuit 102 and the integer number 132 from the coarse TDC circuit 127, depending on which is employed. The term "flip-flop circuit" may be used interchangeably with the terms "data flip-flop" or "flip-flop" herein.

Figure 3:
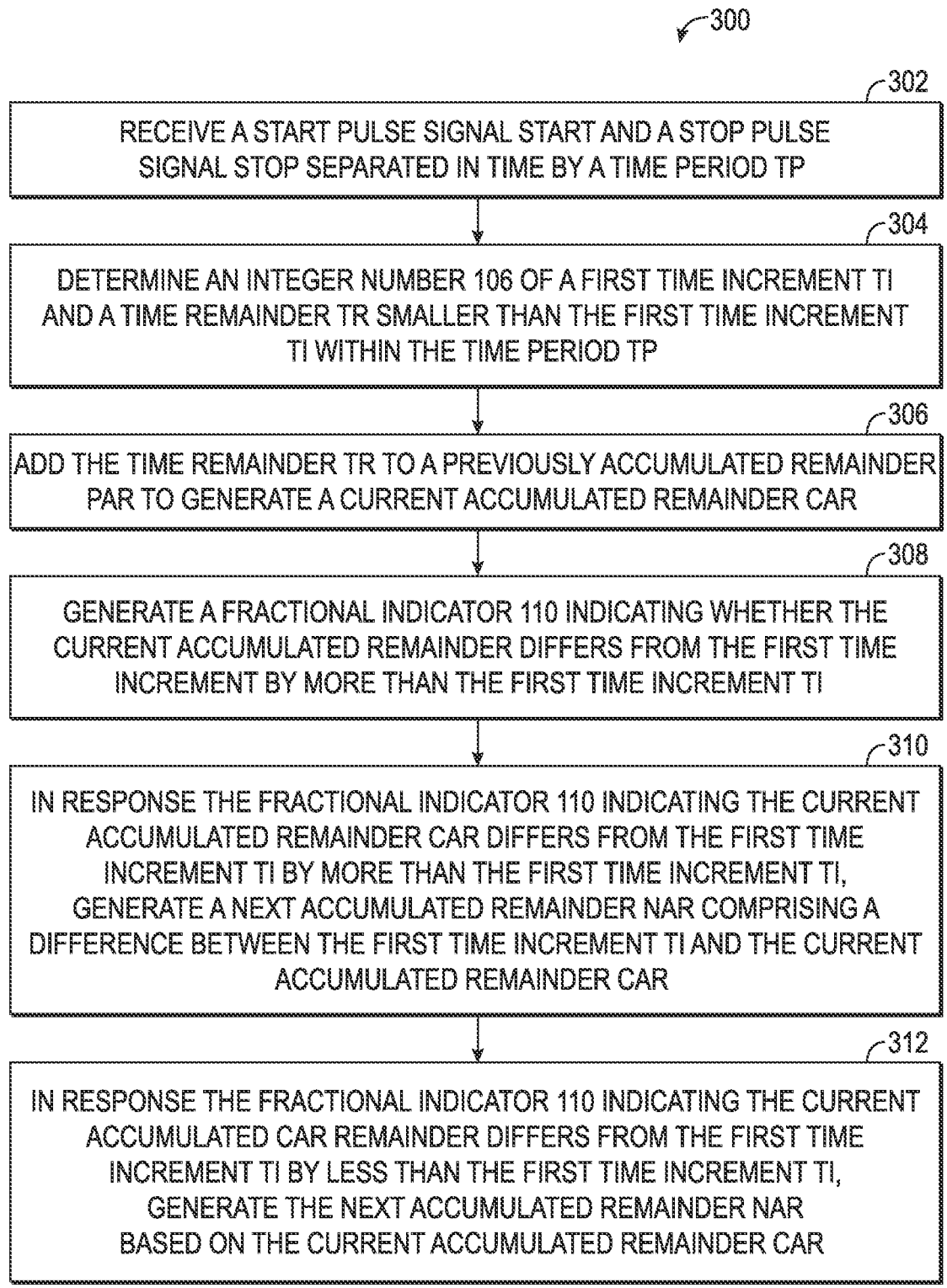
FIG. 3 is a flowchart of a method of the exemplary TDC circuit in FIG. 1, of determining a number of time increments in a time period, accumulating the remainders, and generating an indicator of a fraction of a time increment.

FIG. 3 is a flowchart of a method of the exemplary TDC circuit in FIG. 1 for determining a number of time increments TI and a fraction of a time increment in a time period TP, the method comprising receiving a start pulse signal START and a stop pulse signal STOP separated in time by a time period TP (block 302) and determining an integer number 106 of a first time increment TI and a time remainder TR smaller than the first time increment TI within the time period TP (block 304). The method includes adding the time remainder TR to a previously accumulated remainder PAR to generate a current accumulated remainder CAR (block 306) and generating a fractional indicator 110 indicating whether the current accumulated remainder differs from the first time increment by more than a fraction of the first time increment TI (block 308). The method further includes, in response, the fractional indicator 110 indicating the current accumulated remainder CAR differs from the first time increment TI by more than a fraction of the first time increment TI, generating a next accumulated remainder NAR comprising a difference between the first time increment TI and the current accumulated remainder CAR (block 310) and, in response the fractional indicator 110 indicating the current accumulated CAR remainder differs from the first time increment TI by less than the fraction of the first time increment TI, generating the next accumulated remainder NAR based on the current accumulated remainder CAR (block 312).

Figure 4:
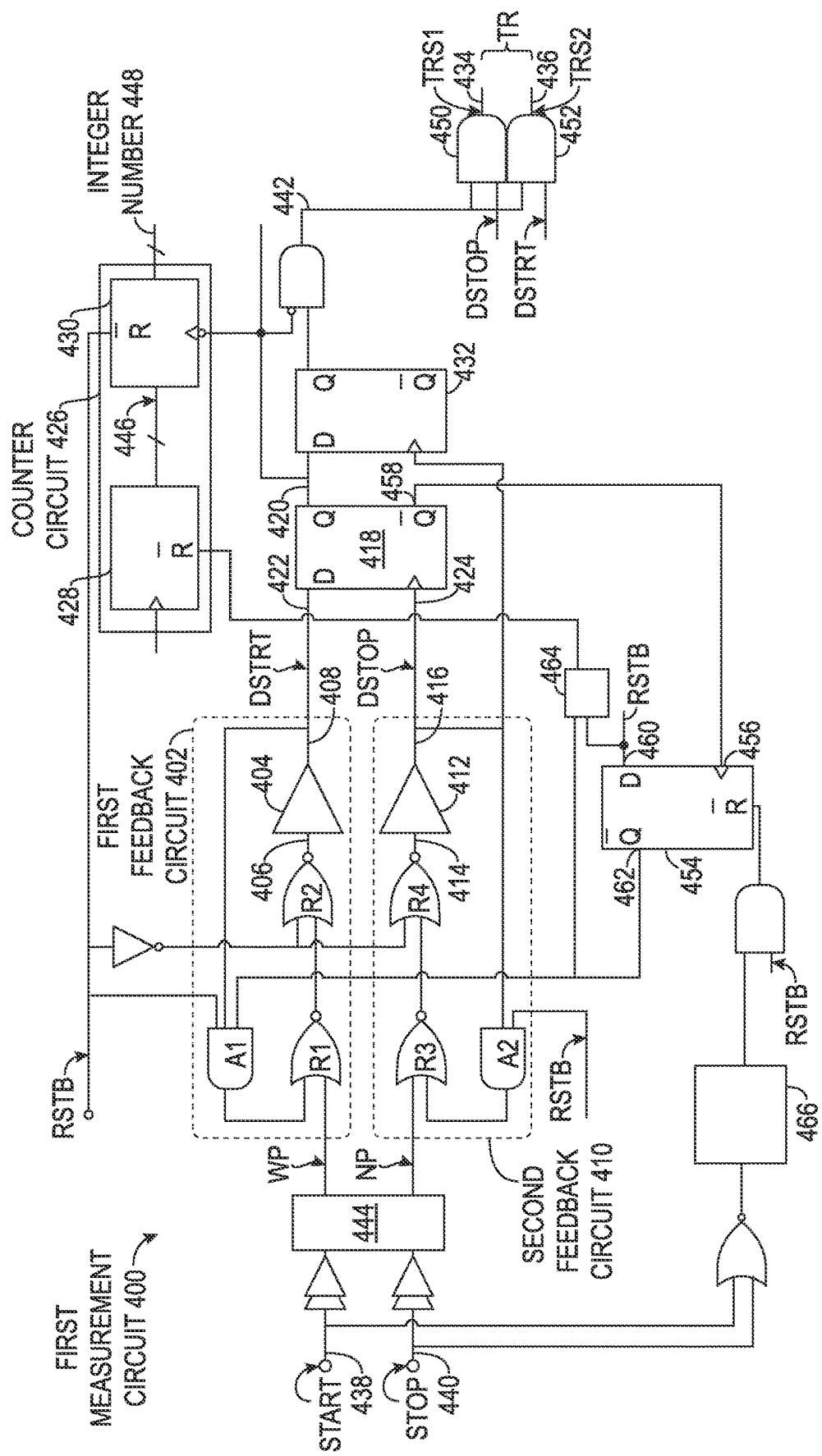
FIG. 4 is a logic circuit diagram illustrating details of the first measurement circuit in the TDC in FIG. 1 to determine a number of time increments in a time period and provide a time remainder to the second measurement circuit.

FIG. 4 is a logic circuit diagram illustrating details of a first measurement circuit 400, which may be the first measurement circuit 104 in the TDC circuit 102 in FIG. 1. The first measurement circuit 400 is employed to determine a number of time increments TI in a time period TP and provide a time remainder TR to the second measurement circuit 108.

The first measurement circuit 400 employs a method similar to a Vernier TDC circuit (not shown) in which a start pulse signal propagates through a series of delay circuits that each have a first delay T1 ("first delay period T1") and a stop pulse signal propagates through a series of delay circuits that each have a second delay T2 ("second delay period T2"). The second delays T2 are shorter than the first delays T1, so the stop pulse signal eventually catches up to the start pulse signal after a number X of delay circuits. From this, it can be determined that the start pulse signal and the stop pulse signal in this example are separated by a time period that is at least X times T1−T2. In such a circuit, a first problem is that the time difference between the start pulse signal and the stop pulse signal may also include a time remainder that is less than T1−T2, which cannot be measured by the Vernier circuit. The resolution of the time measurement by a Vernier circuit is limited to T1−T2, so the time remainder can allow a difference or error in a PLL that is less than T1−T2. A second problem with the Vernier circuit is that the delay circuits in the first series may not all have exactly the same delay T1 due to, for example, process variations in fabrication, and the delay circuits in the second series, for the same reasons, may not all have exactly the delay T2, which can create noise in the output clock generated by the PLL. The TDC circuit 102 addresses both of these problems. The first problem is addressed by the second measurement circuit 108 in FIG. 1, which is described in detail with reference to FIG. 6. The second problem is addressed as follows.

The first measurement circuit 400 includes a first delay feedback circuit 402 comprising a first delay circuit 404 that receives the start pulse signal START at a first delay input 406. The first delay feedback circuit 402 employs the first delay circuit 404 to delay the start pulse signal START and generate a delayed start pulse signal DSTRT on a first delay output 408. The first delay circuit 404 has a delay of duration T1. In this regard, the first delay circuit 404 corresponds to a stage in the first series of delay circuits in a Vernier circuit, but rather than passing the delayed start pulse signal DSTRT to a next delay circuit, the first delay feedback circuit 402 feeds back the delayed start pulse signal DSTRT from the first delay output 408 to the first delay input 406 and reuses the first delay circuit 404 in an iterative manner.

In a similar aspect, the first measurement circuit 400 includes a second delay feedback circuit 410 comprising a second delay circuit 412 that receives the stop pulse signal STOP at a second delay input 414. The second delay feedback circuit 410 employs the second delay circuit 412 to delay the stop pulse signal STOP and generate a delayed stop pulse signal DSTP on a second delay output 416. The second delay circuit 412 has a delay of duration T2, which is shorter than T1. Thus, the time increment TI measurement by the first measurement circuit 400, also referred to as the resolution $T_{RES}$ is T1−T2. In this regard, the second delay circuit 412 corresponds to a stage in the second series of delay circuits in a Vernier circuit, but the second delay feedback circuit 410 feeds back the delayed stop pulse signal DSTP from the second delay output 416 to the second delay input 414 and reuses the second delay circuit 412 iteratively. Employing the first delay feedback circuit 402 and the second delay feedback circuit 410, because the first delay circuit 404 and the second delay circuit 412 are reused, there is no delay mismatch due to different cascaded cells as in a conventional Vernier TDC. In this regard, the first measurement circuit 400, avoids spurious tones.

The first measurement circuit 400 includes a flip-flop circuit 418 with a data output 420 that is set the first time the delayed start pulse signal DSTRT is provided to a data input 422, and the delayed stop pulse signal DSTP is provided to a clock input 424. The data output 420 is reset in a subsequent iteration when the delayed stop pulse signal DSTOP is generated on the second delay output 416 in advance of the delayed start pulse signal DSTRT being generated on the first delay output 408. In other words, the flip-flop 418 is reset when propagation of the delayed stop pulse signal DSTOP through the second delay feedback circuit 410 catches up with propagation of the delayed start pulse signal DSTRT through the first delay feedback circuit 402.

The first measurement circuit 400 includes a counter circuit 426, including a counter 428, and a count flip-flop 430. A trigger flip-flop 432 in the first measurement circuit 400 is employed to detect a transition of the count mode flip-flop 418 and trigger generation of the time remainder TR as a difference between a first time remainder signal TRS1 on a first remainder output 434 and a second time remainder signal TRS2 on a second remainder output 436.

Figure 5:
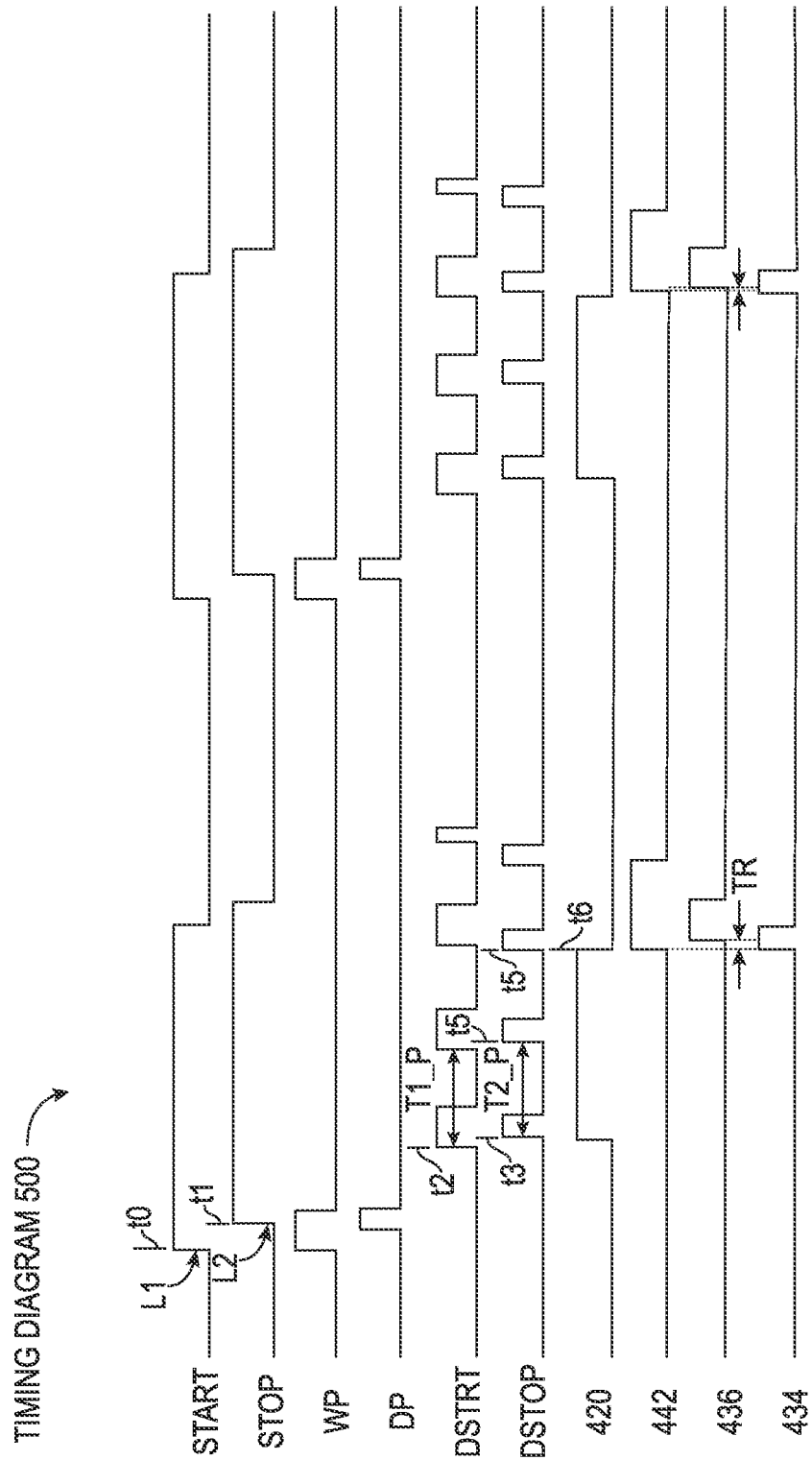
FIG. 5 is a timing diagram illustrating the operation of the first measurement circuit in FIG. 4 in an example of two reference cycles of a reference clock.

A description of additional features of the first measurement circuit 400 and operation thereof is provided with further reference to FIG. 4 and also with reference to the timing diagram 500 in FIG. 5. FIG. 5 is a timing diagram illustrating signals at certain points in the first measurement circuit 400. These signals are represented as binary values (e.g., "0" or low and "1" or high) that may represent voltage levels at the identified points in the first measurement circuit 400. Transitions between these binary values are referred to herein as rising and falling edges, for example, where the passage of time is from left to right.

In particular, starting from the top, the timing diagram 500 includes inputs 438 and 440, which receive the start pulse signal START and the stop pulse signal STOP, respectively. FIG. 5 next includes the first delay input 406, the second delay input 414, the first delay output 408, and the second delay output 416. FIG. 5 also includes the data output 420 of the count mode flip-flop 418 and a node 442 used to trigger generation of the time remainder TR. Finally, FIG. 5 includes the first remainder output 434 and the second remainder output 436 on which the time remainder TR is generated.

As shown in FIG. 5, a leading edge L1 of the start pulse signal START, at which a level of the start pulse signal START rises, occurs at time t0 and, at time t1, a leading edge L2 of the stop pulse signal STOP indicates a rise in the stop pulse signal STOP. The time between the leading edge of the start pulse signal START and the leading edge of the stop pulse signal STOP is the time period TP that is being measured in time increments TI by the first measurement circuit 400 (i.e., TP=t1−t0). The start pulse signal START and the stop pulse signal STOP are received at a pulse generation circuit 444. The pulse generation circuit 444 produces a wide pulse WP corresponding to the start pulse signal START on the first delay input 406 and a narrow pulse NP corresponding to the stop pulse signal STOP on the second delay input 414, respectively. The rise of the narrow pulse NP follows the rise of the wide pulse WP by the time period TP but the narrow pulse NP and the wide pulse WP fall simultaneously.

The wide pulse WP propagates through a first NOR gate (Not-OR circuit) R1 and a second NOR gate R2 before propagating through the first delay circuit 404 to the first delay output 408. The first delay output 408 is coupled to an input of an AND gate A1 which is further coupled back to the first NOR gate R1. In this regard, a feedback loop is formed from the first delay output 408 back to the first delay input 406. A total first feedback loop time T1_P from the first delay output 408, through the first delay feedback circuit 402 and back to the from the first delay output 408 includes the propagation delays through the NOR gates R1 and R2, the AND gate A1, and the first delay circuit 404.

The narrow pulse NP propagates through a third NOR gate R3 and a fourth NOR gate R4 before propagating through the second delay circuit 412 to the second delay output 416. The second delay output 416 is coupled to an input of another AND gate A2, which is further coupled back to the third NOR gate R3. In this regard, a feedback loop is also formed from the second delay output 416 back to the second delay input 414. A total second feedback loop time T2_P through the second feedback delay circuit 410 includes propagation through the NOR gates R3 and R4, the AND gate A2, and the second delay circuit 412.

The wide pulse WP on the first delay output 408 is also referred to as the delayed start pulse signal DSTART and the narrow pulse NP on the second delay output 416 is also referred to as the delayed stop pulse signal DSTOP. The first delay output 408 is coupled to the data input 422 of the count mode flip-flop 418 and the second delay output 416 is coupled to the clock input 424 of the count mode flip-flop 418. Since the range determination circuit 112 in FIG. 1, which includes the low-limit detector 118 to determines that the time period TP provided to the TDC circuit 102 in FIG. 1 is equal to or greater than T1−T2, a first time the wide pulse WP propagates through the first delay circuit 404 to first delay output 408 (see time t2), the rising edge of the wide pulse WP reaches the data input 422 before the rising edge of the narrow pulse NP (see t3) reaches the clock input 424. Thus, the rising edge of the narrow pulse NP triggers the count mode flip-flop 418 to propagate the wide pulse WP from the data input 422 to the data output 420. The second delay output 416 is also coupled to the counter 428 of the counter circuit 426, causing the counter 428 to increment each time the narrow pulse NP propagates (see t3 and t4) through the second delay circuit 412 onto the second delay output 416 after the wide pulse WP has already propagated through the first delay circuit 404 to the first delay output 408. Thus, the counter 428 counts the iterations of the narrow pulse NP through the second delay feedback circuit 410. The number of iterations is provided on a node 446 to the count flip-flop 430.

The data output 420 remains high as the wide pulse WP and the narrow pulse NP are iteratively fed back through the first delay feedback circuit 402 and the second delay feedback circuit 410, respectively. Because the delay T2 of the second delay feedback circuit 410 is shorter than the delay T1 of the first delay feedback circuit 402, the rising edge of the delayed stop pulse signal DSTOP (or narrow pulse NP) will, after some number of iterations, arrive (see t5) on the second delay output 416 before the rising edge of the delayed start pulse signal DSTRT (or wide pulse WP) arrives on the first delay output 408. When the narrow pulse NP arrives on the clock input 424 of the count mode flip-flop 418 before the wide pulse WP arrives on the data input 422 of the count mode flip-flop 418, the data input 422 of the count mode flip-flop 418 is still at the low level when the narrow pulse NP clocks the data input 422 through to the data output 420, causing the data output 420 to drop to the low level at t6.

As noted above, the number of iterations of the delayed stop pulse signal DSTOP on the second delay output 416 is provided by the counter 428 to the count flip-flop 430 on the node 446. When the data output 420 drops to the low level, the count flip-flop 430 stores the count on the node 446 to generate the integer number 448, which may be the integer number 106 in FIG. 1. In this regard, the first measurement circuit 400 determines a number of the time increments TI (equal to T1−T2) that occur in the time period TP. The time remaining in the time period TP is the time remainder TR, which is the difference between the rising edge on the second delay output 416 and the rising edge on the first delay output 408, or the amount of time by which the rising wide pulse WP trails the rising narrow pulse NP.

The data output 420 dropping to the low level also turns on AND gates 450 and 452, which are coupled to the second delay output 416 and the first delay output 408, respectively. Thus, a rising edge first occurs on the first remainder output 434 based on the narrow pulse NP. A rising edge occurs later on the second remainder output 436, corresponding to the wide pulse WP. The time between the rising edge on the first remainder output 434 and the rising edge on the second remainder output 436 is the time remainder TR between the rising edge of the second delay output 416 and the first delay output 408.

The start pulse signal START and the stop pulse signal STOP occur every cycle of the reference clock $C_{REF}$ shown in FIG. 2. Thus, once the integer number 106 has been generated in a first cycle of the reference clock $C_{REF}$, the first measurement circuit 400 needs to be reset to be ready for measuring the time period TP in the next cycle. In this regard, the first measurement circuit 400 includes a reset flip-flop 454 having a clock input 456 that is coupled to a negative data output 458 of the count mode flip-flop 418. When the delayed stop pulse signal DSTP catches up to the delayed start pulse signal DSTART, as described above, and the data output 420 of the count mode flip-flop 418 drops to the low level, the negative data output 458 rises, triggering the clock input 456. A data input 460 of the reset flip-flop 454 receives a master reset signal RSTB, which is not used in normal operation and can be assumed to remain at a high ("1") level. A negative data output 462 of the reset flip-flop 454 causes a pulse generator 464 to reset the counter 428. Upon arrival of the next start pulse signal START and stop pulse signal STOP, a pulse generator 466 resets the reset flip-flop 454. The master reset signal RSTB is provided to other inputs of the first measurement circuit 400, as shown in FIG. 4.

Figure 6A:
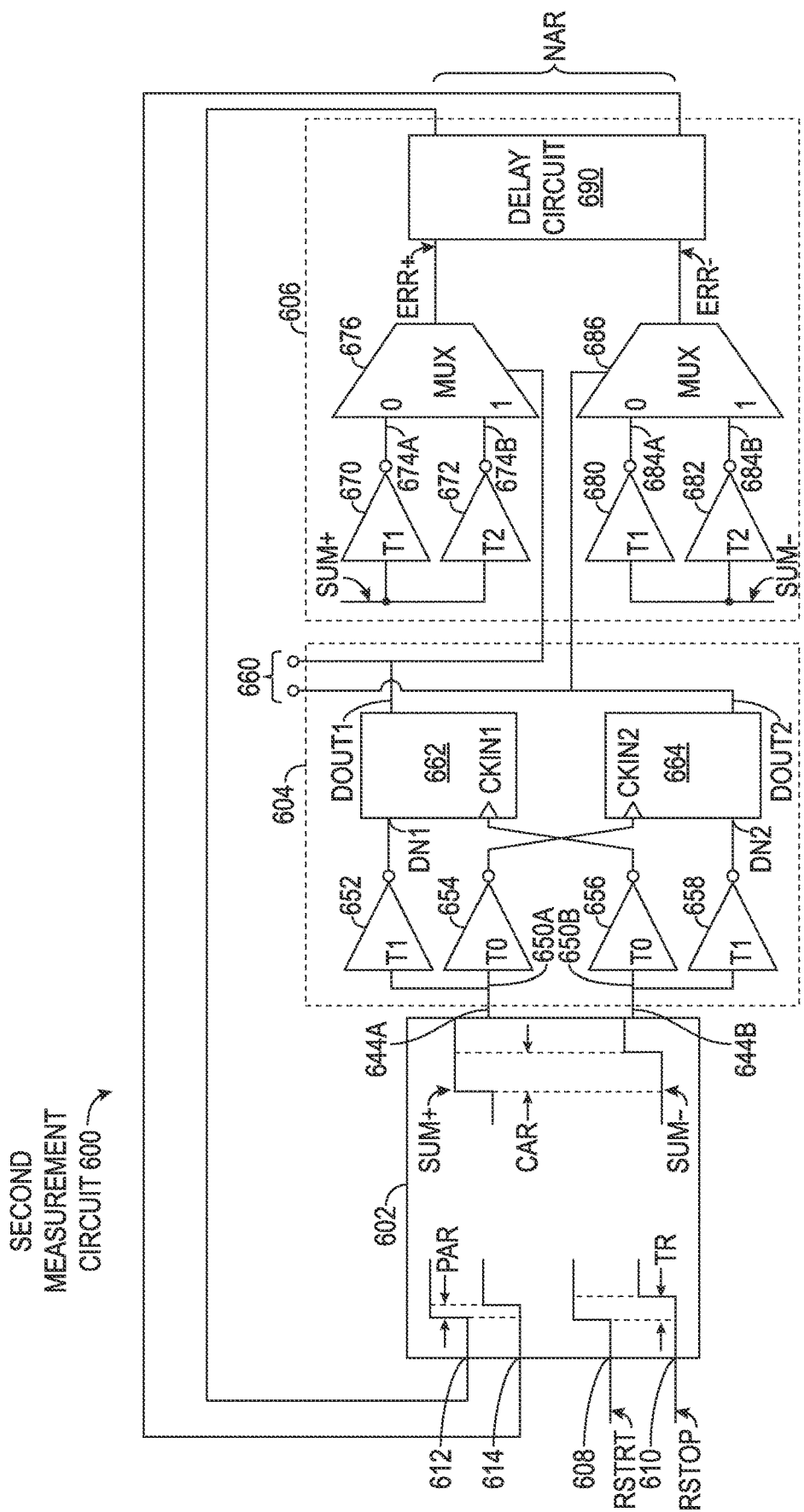
FIG. 6A is a logic circuit diagram illustrating details of the second measurement circuit in the TDC in FIG. 1 for adding the remainder from the first measurement circuit to a previously accumulated remainder, generating a fractional indicator for higher resolution, and calculating a next accumulated remainder.

FIG. 6A is a logic circuit diagram illustrating details of a second measurement circuit 600, which may be the second measurement circuit 108 in the TDC circuit 102 in FIG. 1. The second measurement circuit 600 receives the time remainder TR from the first measurement circuit 104 (or first measurement circuit 400 in FIG. 4), and adds the time remainder TR to a previously accumulated remainder PAR to generate the current accumulated remainder CAR. The second measurement circuit 600 generates a fractional indicator 110 based on the current accumulated remainder CAR, which is added (e.g., by the adder 138 in FIG. 1) to increase the resolution of the integer number 106. The second measurement circuit 600 also calculates a next accumulated remainder NAR. As explained below, the next accumulated remainder NAR generated in one cycle of the start pulse signal START and the stop pulse signal STOP is fed back and becomes the previously accumulated remainder PAR in a next cycle of the start pulse signal START and the stop pulse signal STOP. In this manner, all the time remainders TR contribute to the accuracy of a TDC.

The second measurement circuit 600 includes a time adder circuit 602, an analog to digital converter (ADC) circuit 604, and a digital to analog converter (DAC) circuit 606, explained individually. A detailed logic circuit diagram of the time adder circuit 602 is provided in FIG. 6B. As shown in FIG. 6A, the time adder circuit 602 receives a remainder start signal RSTRT on a first remainder input 608 and receives a remainder stop signal RSTOP on a second remainder input 610. The first remainder input 608 may be coupled to the first remainder output 434 of the first measurement circuit 400 in FIG. 4 and the second remainder input 610 may be coupled to the second remainder output 435. The remainder stop signal RSTOP rises after the remainder start signal RSTRT with a separation in time equal to the time remainder TR of the time period TP. The time adder circuit 602 also receives a previously accumulated remainder PAR on a first PAR input 612 and a second PAR input 614. A separation in time between a rising edge on the first PAR input 612 and a rising edge on the second PAR input 614 is equal to the previously accumulated remainder PAR. The time remainder TR and the previously accumulated remainder PAR are added together by the time adder circuit 602, as described with reference to FIG. 6B.

Figure 6B:
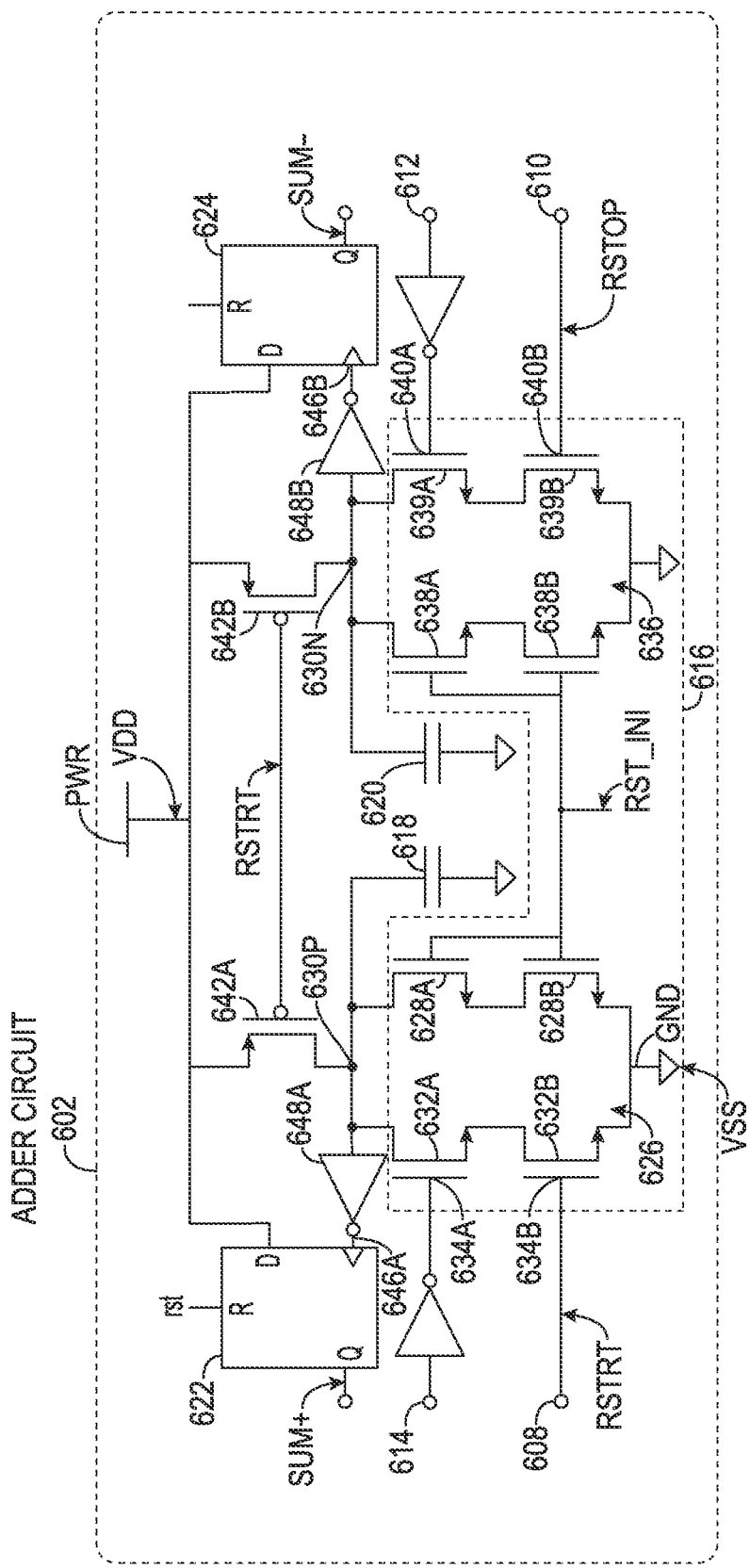
FIG. 6B is a logic diagram illustrating an analog adder circuit for adding the remainder from the first measurement circuit to the previously accumulated remainder.

The time adder circuit 602 in FIG. 6B includes a discharge circuit 616, a first capacitor 618, a second capacitor 620, a first sum flip-flop 622, and a second sum flip-flop 624. A detailed description of the time adder circuit 602 is first provided with reference to FIG. 6B, and a detailed description of the operation thereof is provided with reference to both FIG. 6B and the timing diagram in FIG. 7.

The discharge circuit 616 includes a first discharge control circuit 626, including transistors 628A and 628B, for discharging the first capacitor 618 in response to an initializing reset signal RST_INI. The transistors 628A and 628B are coupled in series between a first node 630P and a ground rail GND. The first discharge control circuit 626 also includes transistors 632A and 632B that are also coupled serially between the first node 630P and the ground rail GND. Control inputs 634A and 634B of the transistors 632A and 632B are coupled, respectively, to the second PAR input 614 and the first remainder input 608.

The discharge circuit 616 also includes a second discharge control circuit 636, including transistors 638A and 638B, for discharging the second capacitor 620 in response to the initializing reset signal RST_INI. The transistors 638A and 638B are coupled in series between a second node 630N and the ground rail GND. The second discharge control circuit 636 also includes transistors 639A and 639B that are also coupled serially between the first node 630P and the ground rail GND. Control inputs 640A and 640B of the transistors 639A and 639B are coupled, respectively, to the first PAR input 612 and the second remainder input 610. The first node 630P is coupled to a power supply rail PWR by a first switch (e.g., a transistor) 642A, and the second node 630N is coupled to the power supply rail PWR by a second switch 642B. The first switch 642A and the second switch 642B, are both controlled by the remainder start signal RSTRT. The first node 630P is coupled to a clock input 646A of the first sum flip-flop 622 via a first inverter 648A and the second node 630N is coupled to a clock input 646B of the second sum flip-flop 624 via a second inverter 648B.

The first remainder input 608 (RSTRT) and the second remainder input 610 (RSTOP) are at a low level before the time remainder TR is provided. The low level of the remainder start signal RSTRT controls the first switch 642A and the second switch 642B to be open to couple the first node 630P and the second node 630N to the power supply rail PWR, thereby charging both of the first capacitor 618 and the second capacitor 620 to a first voltage VDD, which may be a power supply voltage. The first PAR input 612 and the second PAR input 614 are also at a low level initially, turning on the transistor 632A in the first discharge control circuit 626 and turning on the transistor 638A in the second discharge control circuit 636. The low levels in the first and second remainder inputs 608, 610 keep the transistors 632B and 638B shut off. Thus, even though the transistors 632A and 638A are turned on, the first capacitor 618 and the second capacitor 620 cannot discharge through the first and second discharge control circuits 626, 636 in the initial state of FIG. 7.

Figure 7:
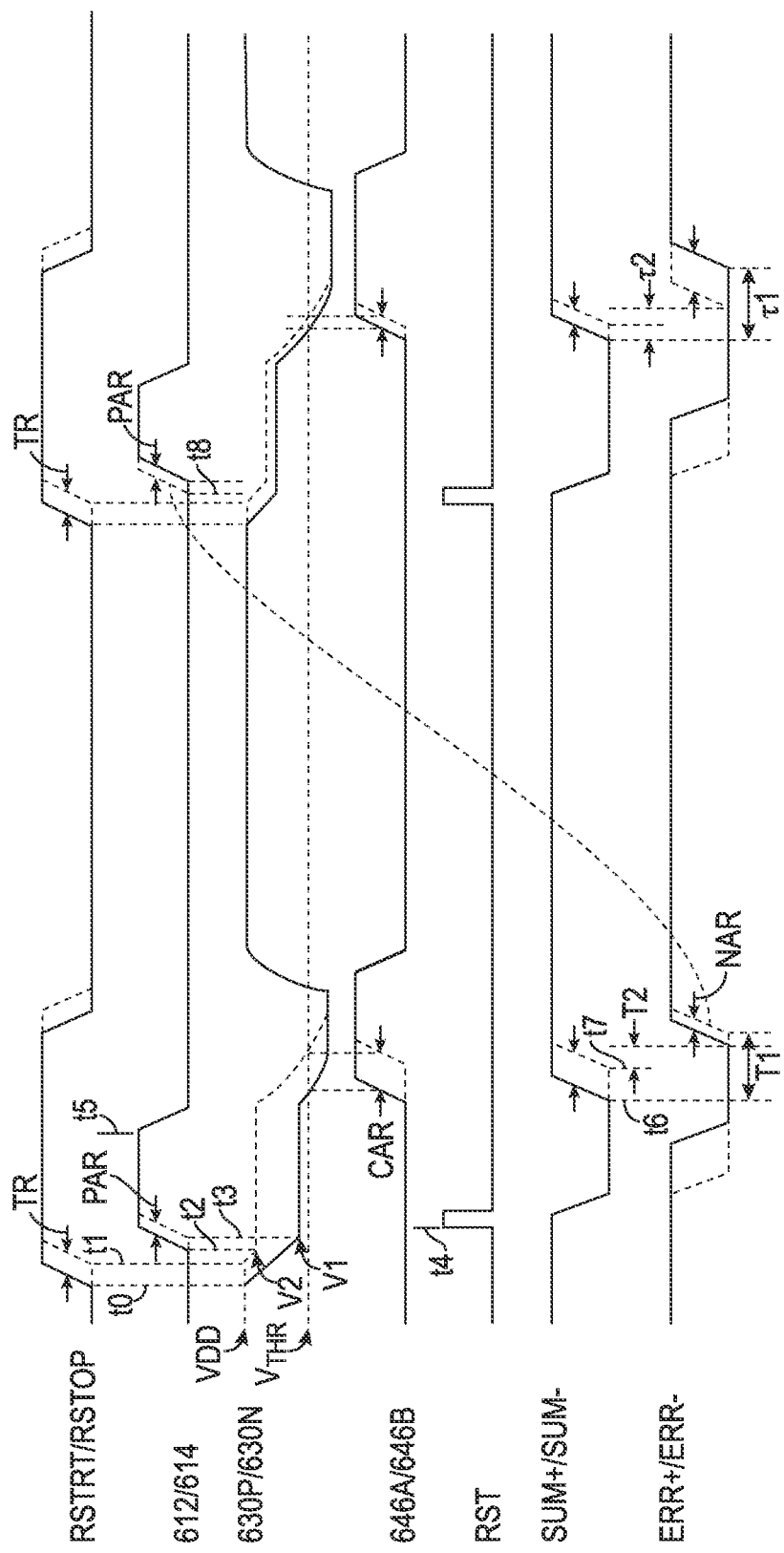
FIG. 7 is a timing diagram illustrating adding the time remainder from the first measurement circuit to a previously accumulated remainder to generate a current accumulated remainder and subtracting the time increment from the current accumulated remainder if the current accumulated remainder exceeds a fraction of the time increment to generate a next accumulated remainder in the TDC circuit in FIG. 1.

At time t0 of the timing diagram in FIG. 7, a rising transition of the first remainder input 608 shuts off the first and second switches 642A, 642B. The rising transition of the first remainder input 608 turns on the transistor 632B, allowing the first capacitor 618 to begin to discharge, as shown by a voltage of the first node 630P in FIG. 7. The rise of the first remainder input 608 is followed at time t1 by a rising transition of the second remainder input 610 with a separation time equal to the time remainder TR. The rise of the second remainder input 610 turns on the transistor 638B, allowing the second capacitor 620 to discharge, as shown in FIG. 7, by a voltage on the second node 630N. The first capacitor 618 is discharging for the duration of the time remainder TR, then both of the first capacitor 618 and the second capacitor 620 continue to discharge after the rise of the second remainder input 610.

Assuming that the first capacitor 618 and the second capacitor 620 are discharged at a same rate, a difference between a voltage at the first node 630P and a voltage at the second node 630N at time t1 corresponds to the time remainder TR. As both of the first capacitor 618 and the second capacitor 620 continue to discharge, this difference remains constant. At a time t2 shortly after the rise of the second remainder input 610 at t1, one of the first PAR input 612 and the second PAR input 614 occurs. In the first example in FIG. 7, the first PAR input 612 rises at t2, shutting off the transistor 638A, which stops discharge of the second capacitor 620 (e.g., the node 630N) from the first voltage VDD to a second reduced voltage V2 while the first capacitor 618 continues to discharge. At time t3, which follows time t2 by a time equal to the preview accumulated reminder PAR, the second PAR input 614 rises also, shutting off the transistor 632A to stop discharging of the first capacitor 618 (e.g., the node 630P) from the first voltage VDD to a first reduced voltage V1. Thus, the duration of the discharge of the first capacitor 618 differs from the duration of the discharge of the second capacitor by a time equal to the time remainder TR and the previously accumulated remainder PAR. Since this discharge duration time difference corresponds to a difference in voltage based on a same rate of discharge, a difference in voltage between the first node 630P and the second node 630N at time t3 is related to a sum of the time remainder TR and the previously accumulated remainder PAR.

At time t4, a reset signal RST (unrelated to the master reset signal RSTB discussed above) resets a first sum signal SUM+ on an adder output 644A of the first sum flip-flop 622 and resets ta second sum signal SUM-on an adder output 644B of the second sum flip-flop 624 to a low level. As shown in FIG. 7, although the first node 630P and the second node 630N have fallen in voltage, which causes a rise in voltage at the clock inputs 646A and 646B due to the inverters 648A and 648B, the first sum flip-flop 622 and the second sum flip-flop 624 are not triggered (e.g., clocked). However, at time t5, both of the first PAR input 612 and the second PAR input 614 transition to a low level, causing the transistors 632A and 638A to turn back on to discharge both of the first capacitor 618 and the second capacitor 620 at the same rate. Due to the difference in voltages on the first node 630P and the second node 630N, the first node 630P is the first to fall below a threshold voltage $V_{THR}$ at which the clock input 646A of the first sum flip-flop 622 is triggered, setting the first sum signal SUM+ at time t6. Since the difference in voltage between the first node 630P and the second node 630N is related to the sum of the time remainder TR and the previous accumulated remainder PAR, the second node 630N will discharge to fall below the threshold voltage $V_{THR}$, causing the clock input 646B to be activated and setting the second sum signal SUM- of the second sum flip-flop 624 at time t7. In this manner, the time difference between the activation of the first sum signal SUM+ and the second sum signal SUM- is also equal to the sum of the time remainder TR and the previously accumulated remainder PAR, which is the current accumulated remainder CAR.

Referring back to FIG. 6A, the first and second sum signals SUM+ and SUM- are outputs from the time adder circuit 602 and are coupled to a first input 650A and a second input 650B, respectively, of the ADC circuit 604. A function of the ADC circuit 604 is to determine whether a magnitude of the current accumulated remainder CAR (which may be positive or negative) is greater than a fraction of the time increment TI. In this example, the fraction is one-half (½). The ADC circuit 604 includes first T1 delay circuit 652 and first T0 delay circuit 654, which are both coupled to the first input 650A. The ADC circuit 604 includes a second T0 delay circuit 656 and a second T1 delay circuit 658, which are both coupled to the second input 650B. The first and second T1 delay circuits 652 and 658 have a same delay of duration T1 as the first delay circuit 404. The first and second T0 delay circuits 654 and 656 have a same delay of duration T0.

For reasons explained below with reference to the DAC circuit 606, a difference between T1 and T0 is half of the difference between T1 and T2 in FIG. 4. That is, the time increment TI used in the first measurement circuit 400 in FIG. 4, which determines the resolution of the TDC circuit 102 in FIG. 1, is two times the difference between T1 and T0, or T1−T0=(T1−T2)/2. The ADC circuit 604 generates a fractional indicator 660, corresponding to the fractional indicator 110 in FIG. 1, to indicate whether the current accumulated remainder CAR has a magnitude greater than TI/2 or not and whether it is positive or negative.

The ADC circuit 604 also includes a positive arbiter 662 and a negative arbiter 664. The first T1 delay circuit 652 is coupled to a data input DINI of the positive flip-flop 662, and the second T0 delay circuit 656 is coupled to the clock input CKIN1 of the first positive flip-flop 662. In the above example, where the current accumulated remainder CAR is a positive value, a rising edge on the second sum signal SUM− (output 644B) follows a rising edge on the first sum signal SUM+ (output 644A) by a time equal to the current accumulated remainder CAR. In such an example, the rising edge on the output 644A propagates through the first T1 delay circuit 652, and the rising edge on the output 644B, which arrives later, propagates through the second T0 circuit delay. If the current accumulated delay CAR is greater than T1−T0, the rising edge propagating through the first T1 delay circuit 652 will reach the data input DINI of the positive flip-flop 662 before the rising edge propagating through the second T0 delay circuit 656 reaches the clock input CKIN1, and a data output DOUT1 of positive flip-flop 662 is set to the high level ("1"). On the other hand, if the current accumulated delay CAR is less than T1−T0, the rising edge propagating through the second T0 delay circuit 656 reaches the clock input CKIN1 before the rising edge propagating through the first T1 delay circuit 652 will reach the data input DINI of the positive flip-flop 662, and the data output DOUT1 of positive flip-flop 662 is set to the low level ("0").

A currently accumulated remainder CAR having a negative value will cause a rising edge to occur first on the output 644B, followed by a rising edge on the output 644A. In the manner described above, the rising edges propagating through the first T0 delay circuit 654 and the second T1 delay circuit 658 will cause a data output DOUT2 of the negative flip-flop 664 to be set to "1" if the magnitude of the current accumulated remainder CAR is greater than T1−T0, and will otherwise be set to "0". The fractional indicator 660 is determined by the positive flip-flop 662 and the negative flip-flop 664. In this example, the fractional indicator 660 may be a two-bit binary value of 01, 00, or 10.

As noted, the fractional indicator 660 may be the fractional indicator 110 in FIG. 1, and the integer number 448 in FIG. 4 may be the integer number 106. The fractional indicator 110 is used to effectively round up or round down the integer number 106 based on the current accumulated remainder CAR. Including the fractional indicator 110 with the integer number 106, the TDC circuit 102 improves the accuracy over a TDC circuit with only an integer number output, where the remainders are unaccounted for. This adjustment is explained in the following examples.

If a first example in which the current accumulated remainder CAR is +0.75(TI), which is greater than TI/2, the fractional indicator 660 will cause the integer number provided to the DCO 202 to increment by 1. As should be understood, this is an over-adjustment in response to the actual time remainder TR in a given cycle. However, the next accumulated remainder NAR will be −0.25(TI) to compensate for the over-adjustment in the next cycle (or later).

In a second example, the current accumulated remainder CAR is any value between ~+0.49(TI) and ~−0.49(TI) (providing a small margin compared to 0.5, in consideration of possible device variation and jitter impact), the fractional indicator will not cause the integer number 106 in FIG. 1 to be changed, and the current accumulated remainder CAR will become the next accumulated remainder NAR to be used in the next cycle.

In a third example, the current accumulated remainder CAR is −0.82(TI), so the fractional indicator 660 will cause the integer number 106 to be decremented, and +0.18(TI) is provided as the next accumulated remainder NAR.

Based on the above examples, it can be seen that, on average, the phase differences between the output clock $C_{OUT}$ and the reference clock $C_{REF}$ will be significantly reduced.

The purpose of the DAC circuit 606 is to provide the next accumulated remainder NAR from a current cycle as the previously accumulated remainder PAR in a next cycle. The DAC circuit 606 can use the output of the ADC circuit 604 to determine whether to add or subtract the time increment TI (=T1−T2) to the current accumulated remainder CAR to generate the NAR. The DAC circuit 606 is first structurally described with reference to FIG. 6A, and the operation thereof is described with additional reference back to FIG. 7.

The DAC circuit 606 includes a first T1 delay circuit 670 and a first T2 delay circuit 672, which are both coupled to the output 644A and are respectively coupled to first and second inputs 674A and 674B of a multiplexor 676. The DAC circuit 606 includes a second TI delay circuit 680 and a second T2 delay circuit 682, which are both coupled to the output 644B and are respectively coupled to first and second inputs 684A and 684B of a multiplexor 686. An output ERR+ of the multiplexor 676 and an output ERR− of the multiplexor 686 are coupled to a delay circuit 690.

Referring back to FIG. 7, rising edges on the first and second sum signals SUM+ and SUM− are shown at times t5 and t6, respectively, with the first sum signal SUM+ rising first, which occurs when the sign of the current accumulated remainder CAR is positive. In the negative case, a rising edge occurs on the second sum signal SUM-before a rising edge on the first sum signal SUM+.

At time t6, the rising edge of the output SUM+ is provided to the first T1 delay circuit 670 and the first T2 delay 672. Based on the fractional indicator 660, the multiplexor 676 selects the first sum signal SUM+ delayed by T1 to be provided on the output ERR+. At time t7, the rising edge of the second sum signal SUM− is provided to the second T1 delay circuit 680 and the second T2 delay 682, and the multiplexor 686 selects the SUM-delayed by T2 to be provided on the output ERR−. In this manner, the time difference between first and second sum signals SUM+ and SUM− has been reduced by the time increment TI (T1−T2). That is the time difference between ERR+ and ERR−, which is the next accumulated remainder NAR, shown as the previously accumulated remainder PAR in the next cycle at time t78. As shown, the NAR is a negative amount equal to the current accumulated remainder CAR minus (T1−T2). The delay circuit 690 delays ERR+ and ERR− by a same amount of time and is coupled to the first PAR input 612 and a second PAR input 614, where the next accumulated remainder NAR from one cycle of the reference clock $C_{REF}$ is stored and provided as the previously accumulated remainder PAR in a next cycle.

Figure 8:
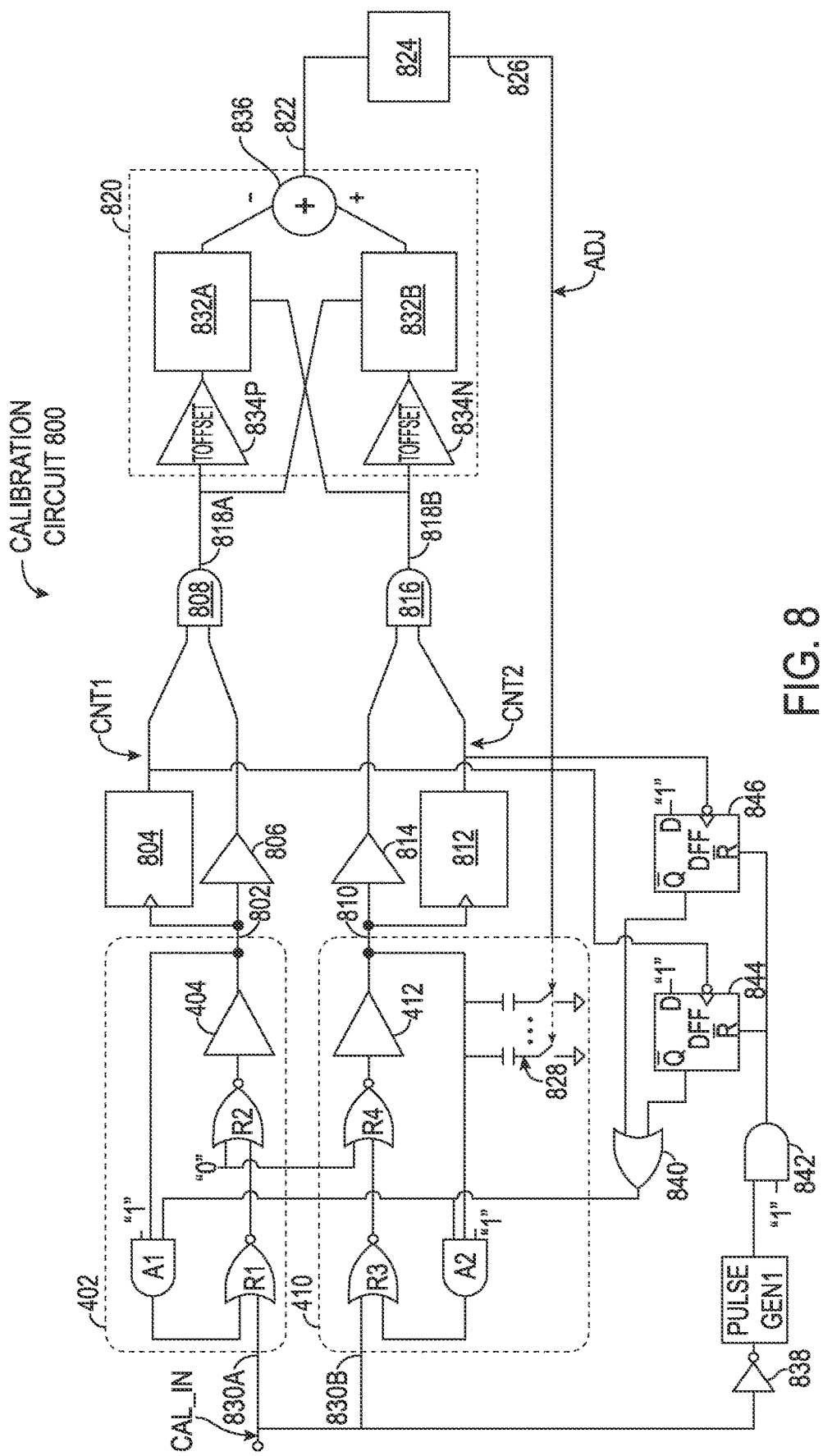
FIG. 8 is a logic circuit diagram of a calibration circuit for calibrating the timing resolution of the first measurement circuit of FIG. 4.

FIG. 8 is a logic circuit diagram of a calibration circuit 800, including the first feedback circuit 402 and the second feedback delay circuit 410 of FIG. 4, for the purpose of calibrating the time resolution $T_{RES}$, which is a difference between the first delay period T1_P of the first feedback circuit 402 and the second delay period T2_P of the second feedback delay circuit 410. Details of the first feedback circuit 402 and the second feedback delay circuit 410 are provided above and are not repeated here. The difference between T1_P and T2_P is known if a first number or count CNT1 of the first delay period T1_P is equal to a second number or count CNT2 of the second delay period T2_P. This may be shown as an equation:

$$CNT1 \times T1\_P = CNT2 \times T2\_P.$$

In one example, if CNT1=4 and CNT2=5, then (4)×T1_P=(5)×T2_P.

Since $T_{RES}$=T1_P−T2_P, then it can be seen that $T_{RES}$=T1_P/5 in this example.

As a reminder, the first delay period T1_P in FIG. 4 is based on the first delay T1 of the first delay circuit 404, the NOR gates R1 and R2, and the AND gate A1. The second delay period T2_P is based on the second delay T2 of the second delay circuit 412, the NOR gates R3 and R4, and the AND gate A2. Assuming the NOR gates R1-R4 are all of a same delay and the AND gates A1 and A2 are also of a same delay, the primary difference between first delay period T1_P and second delay period T2_P is based on a difference between the first delay T1 and the second delay T2. The first delay T1 and the second delay T2 may be selected to satisfy the equation above where T1_P=10 ns and T2_P=8 ns. However, variations in propagation delay are inevitable among all the components, so the calibration circuit 800 is provided to achieve or approach the above relationship of CNT1×T1_P=CNT2×T2_P.

A calibration operation of the calibration circuit 800, which may be performed in a calibration mode of the first measurement circuit 400, counts a number of iterations of the CAL_IN determines whether CNT1×T1_P=CNT2×T2_P and adjusts the second delay period T2_P. Alternatively, the calibration circuit 800 may adjust the first delay period T1_P or both the first delay period T1_P and the second delay period T2_P. Such operation is described below following a description of components of the calibration circuit 800.

The first delay output 802 of the first delay feedback circuit 402 is coupled to a calibration counter 804 and a time delay 806. Both of the calibration counter 804 and the time delay 806 are coupled to AND gate 808. Similarly, a second delay output 810 of the second delay feedback circuit 410 is coupled to inputs of a second calibration counter 812 and a time delay 814, which are both further coupled to an AND gate 816.

The AND gates 808 and 816 have respective outputs 818A and 818B, which are coupled to an order determination circuit 820. An output 822 of the order determination circuit 820 is provided to an adjustment circuit 824, which can generate an adjustment signal ADJ on an output 826. The output 826 is coupled to a variable capacitor 828 that is further coupled to the second delay output 810 of the second delay feedback circuit 410.

Figure 9:
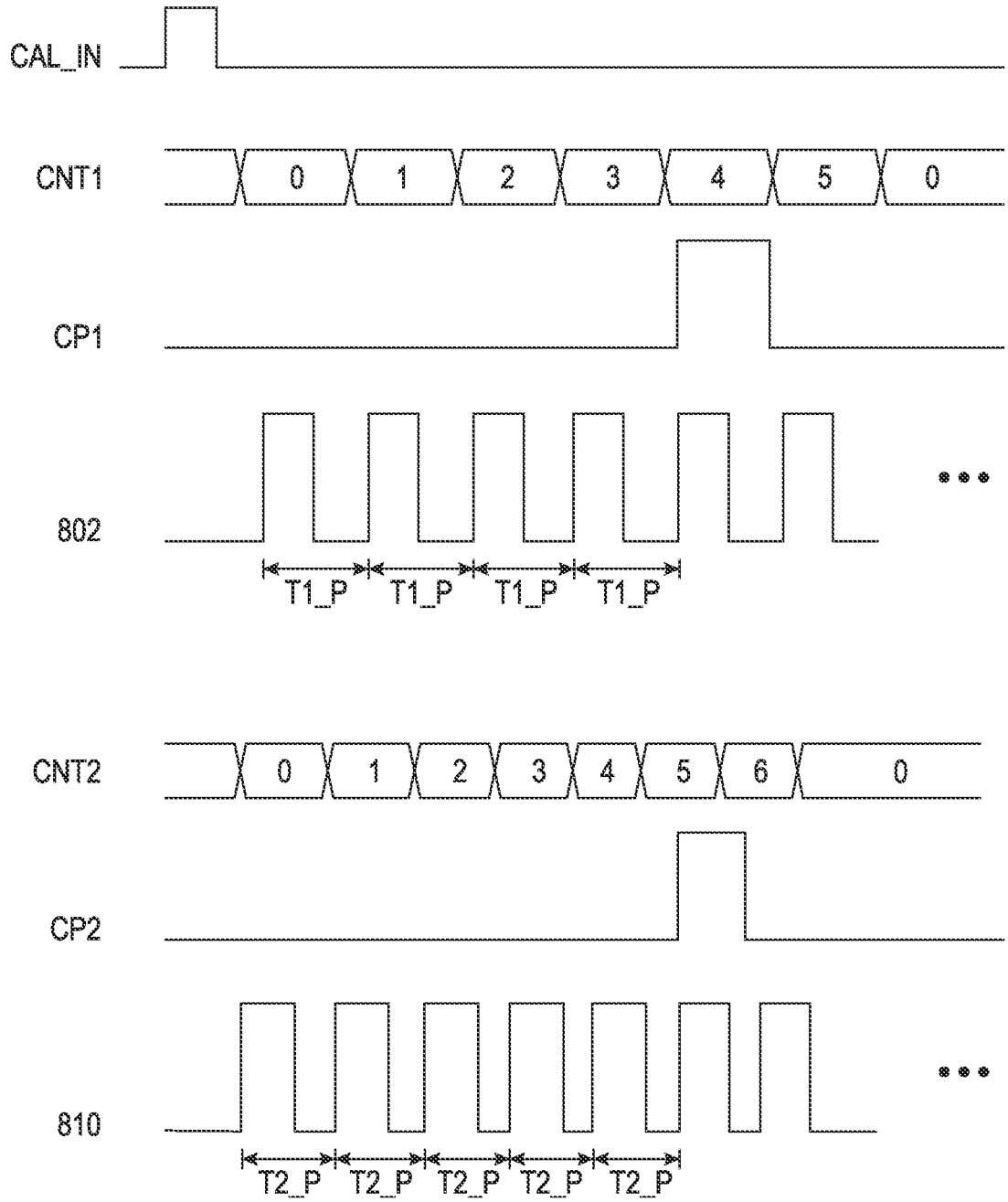
FIG. 9 is a timing diagram illustrating signal of the calibration circuit in FIG. 8 during a calibration process.

In the calibration mode, inputs 830A and 830B of the first and second delay circuits 402, 410 are coupled together to receive a calibration pulse signal CAL_IN simultaneously, as shown in FIG. 9. The calibration counter 804 counts a first number of iterations of the calibration pulse signal CAL_IN propagating through the first delay circuit 402 in a feedback loop and the calibration counter 812 counts a second number of iterations of the calibration pulse signal CAL_IN propagating through the second delay feedback circuit 410.

When the calibration counter 804 count CNT1 reaches the desired value (e.g., 4 in the example above), a first calibration pulse CP1 is generated by the calibration counter 804 to the AND gate 808. The time delay 806 delays the CAL_IN pulse received from the first delay output 810 to synchronize the first calibration pulse CP1 to the AND gate 808. When the calibration counter 812 count CNT2 reaches that desired value (e.g., 5), a second calibration pulse CP2 is generated by the calibration counter 812 and provided to the AND gate 816, synchronized by the CAL_IN pulse propagating through the time delay 814.

The order determination circuit 820 includes arbiter circuits 832A and 832B. The first calibration pulse CP1 is provided as data to the arbiter circuit 832A through a first offset (delay) circuit 834P and the first calibration pulse CP1 is also provided, without a delay, to clock the arbiter circuit 832B. Similarly, the second calibration pulse CP2 is provided as data to the flip-flop circuit 832B through a second offset circuit 834N and the second calibration pulse CP2 is also provided, without an offset delay, to clock the arbiter circuit 832A. It can be seen that, due to the offset circuits 834P and 834N, neither of the flip-flop circuits 832P and 832N will be set (e.g., to "1") unless the difference in time between the first calibration pulse CP1 and the second calibration pulse CP2 is greater than the offset delay. An incrementer 836 generates the adjustment signal ADJ as one of +1, 0, or −1 on the output 826, depending on the flip-flop circuits 832P and 832N.

For example, if the flip-flop circuit 832P is set by the second pulse signal CP2 at the first clock input CK1, the second calibration pulse CP2 is leading the first calibration pulse CP1 by at least the offset delay of offset circuit 834P. Thus, if the first calibration pulse CP1 and the second calibration pulse CP2 are separated in time by more than the offset delay, the incrementer 836 will generate an appropriate one of +1 or −1 to cause the adjustment signal ADJ to increase capacitance of the variable capacitor 828 which increases capacitance on the second delay output 810 and increase the second delay period T2_P. The variable capacitor 828 can be adjusted to increase or decrease capacitance by the adjustment signal ADJ. The adjustment signal ADJ may adjust the capacitance of the variable capacitor 828 by an incremental amount and the operation describe above will be repeated until the first calibration pulse CP1 and the second calibration pulse CP2 are separated by less than the offset delay, causing the adjustment signal ADJ to be "0". The variable capacitor 828 is held at the determined capacitance value during normal operation outside the calibration mode. Employing the calibration circuit 800, the time increment TI can be in the range of less than 5% of T1_P. In some examples, the time increment TI can be less than 2% of T1_P.

One operation of the calibration circuit 800 can be seen in the timing diagram 900 in FIG. 9. After the calibration pulse signal CAL_IN arrives, the count CNT1 of the counter 804 and the count CNT2 of the calibration counter 812 both increment in response to the calibration pulse signal CAL_IN propagating to the first delay output 802 and the second delay output 810. The count CNT1 increments each time the calibration pulse signal CAL_IN propagates to the first delay output 802, and the count CNT2 of the calibration counter 812 increments each time the calibration pulse signal CAL_IN propagates to the second delay output 810. Circuits 838, 840, 842, 844, and 846 are employed to reset the calibration circuit 800 to be ready for the next calibration pulse signal CAL_IN.

Figure 10:
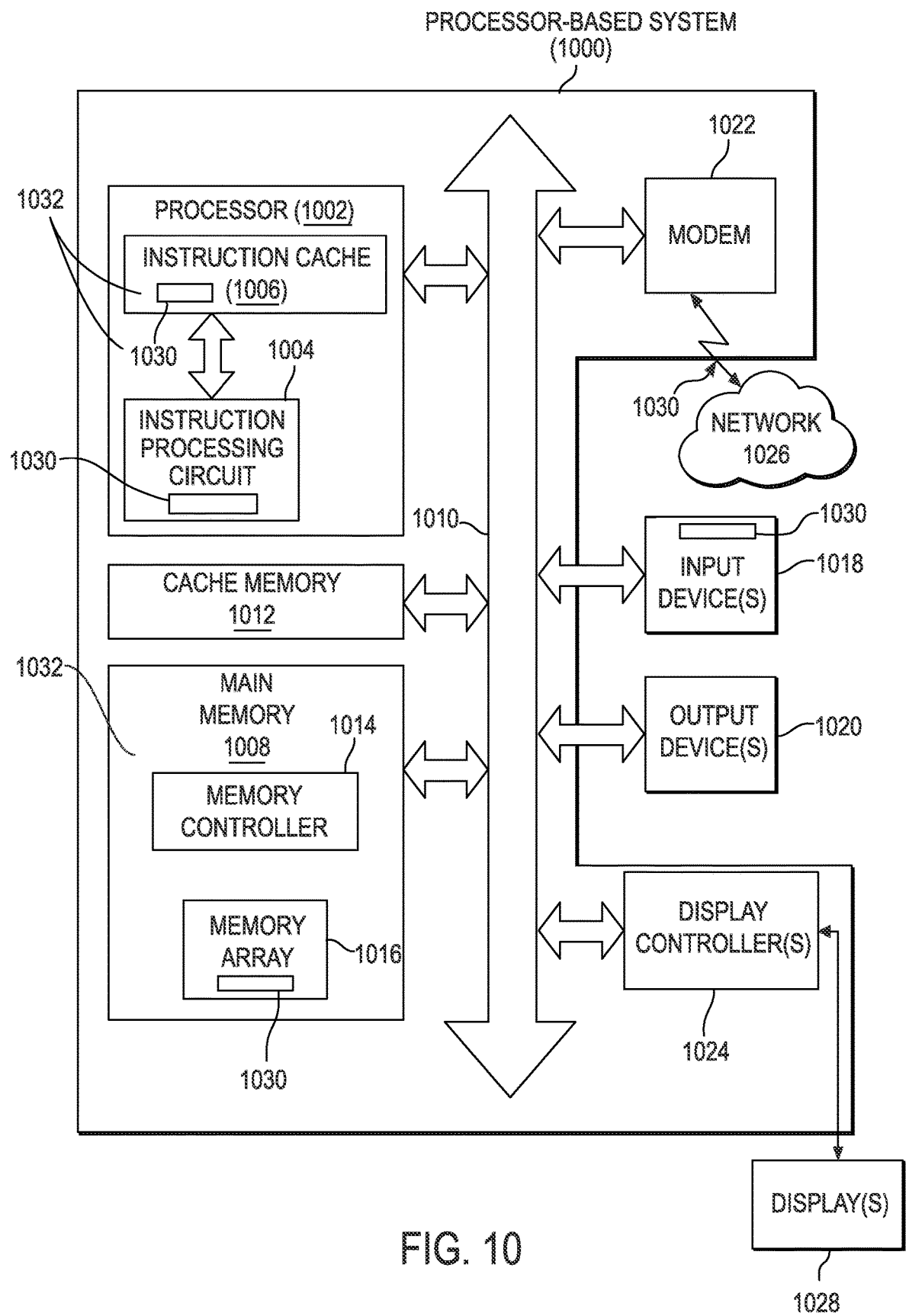
FIG. 10 is a block diagram of an exemplary processor-based system that can include a PLL that includes the TDC circuit in a TDC system, as shown in FIGS. 1, 4, 6A, and 6B.

FIG. 10 is a block diagram of an exemplary processor-based system 1000 that includes a processor 1002 (e.g., a microprocessor) that includes an instruction processing circuit 1004 and a PLL 200 of FIG. 2 and a TDC system 100 of FIG. 1. Any of the processor-based system 1000, the processor 1002, and the instruction processing circuit 1004 can be the IC chip 101 in FIG. 1 as an example. The processor-based system 1000 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer.

In this example, the processor 1002 represents one or more general-purpose processing circuits, such as a microprocessor, central processing unit, or the like. The processor 1002 is configured to execute processing logic in instructions for performing the operations and steps discussed herein. In this example, the processor 1002 includes an instruction cache 1006 for temporary, fast access memory storage of instructions accessible by the instruction processing circuit 1004. Fetched or prefetched instructions from a memory, such as from the cache memory 1012 over a system bus 1010, are stored in the instruction cache 1006. The instruction processing circuit 1004 is configured to process instructions fetched into the instruction cache 1006 and process the instructions for execution.

The processor 1002 and the cache memory 1012 are coupled to the system bus 1010 and can intercouple peripheral devices included in the processor-based system 1000. As is well known, the processor 1002 communicates with these other devices by exchanging address, control, and data information over the system bus 1010. For example, the processor 1002 can communicate bus transaction requests to a memory controller 1014 in the main memory 1008 as an example of a slave device. Although not illustrated in FIG. 10, multiple system buses 1010 could be provided, wherein each system bus constitutes a different fabric. In this example, the memory controller 1014 is configured to provide memory access requests to a memory array 1016 in the main memory 1008. The memory array 1016 is comprised of an array of storage bit cells for storing data. The main memory 1008 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 1010. As illustrated in FIG. 10, these devices can include the main memory 1008, one or more input device(s) 1018, one or more output device(s) 1020, a modem 1022, and one or more display controllers 1024, as examples. The input device(s) 1018 can include any type of input device, including but not limited to input keys, switches, voice processors, etc. The output device(s) 1020 can include any type of output device, including but not limited to audio, video, other visual indicators, etc. The modem 1022 can be any device configured to allow exchange of data to and from a network 1026. The network 1026 can be any type of network, including but not limited to a wired or wireless network, a private or public network, a local area network (LAN), a wireless local area network (WLAN), a wide area network (WAN), a BLUETOOTH™ network, and the Internet. The modem 1022 can be configured to support any type of communications protocol desired. The processor 1002 may also be configured to access the display controller(s) 1024 over the system bus 1012 to control information sent to one or more displays 1028. The display(s) 1028 can include any type of display, including but not limited to a cathode ray tube (CRT), a liquid crystal display (LCD), a plasma display, etc. Any of the input devices 1018, the modem 1022, and the output devices 1020 may be the IC chip 101 or otherwise may include the TDC system 100.

The processor-based system 1000 in FIG. 10 may include a set of instructions 1030 to be executed by the processor 1002 for any application desired according to the instructions. The instructions 1030 may be stored in the main memory 1008, processor 1002, and/or instruction cache 1006 as examples of a non-transitory computer-readable medium 1032. The instructions 1030 may also reside, completely or at least partially, within the main memory 1008 and/or within the processor 1002 during their execution. The instructions 1030 may further be transmitted or received over the network 1026 via the modem 1022, such that the network 1026 includes the computer-readable medium 1032 while the computer-readable medium 1032 is shown in an exemplary embodiment to be a single medium, the term "computer-readable medium" should be taken to include a single medium or multiple media (e.g., a centralized or distributed database and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memories, etc.), and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A time-to-digital converter (TDC) circuit comprising:
a first measurement circuit configured to:
   receive a start pulse signal and a stop pulse signal separated in time by a time period;
   determine an integer number of consecutive first time increments in the time period; and
   determine a time remainder of the time period smaller than one of the first time increments; and
a second measurement circuit configured to:
   add the time remainder to a previously accumulated remainder to generate a current accumulated remainder;
   generate a fractional indicator indicating whether a magnitude of the current accumulated remainder is greater than half of the first time increment;
   in response to the fractional indicator indicating the magnitude of the current accumulated remainder is greater than half of the first time increment, generate a next accumulated remainder comprising a first difference between the first time increment and the current accumulated remainder; and
   in response to the fractional indicator indicating the magnitude of the current accumulated remainder is less than half of the first time increment, generate the next accumulated remainder comprising the current accumulated remainder.

2. The TDC circuit of claim 1, the first measurement circuit comprising:
a first delay feedback circuit comprising a first delay circuit configured to:
   receive a start pulse signal at a first delay input;
   delay the start pulse signal for a first delay period to generate a delayed start pulse signal on a first delay output; and
   feed back the delayed start pulse signal from the first delay output to the first delay input;
a second delay feedback circuit comprising a second delay circuit configured to:
   receive a stop pulse signal at a second delay input;
   delay the stop pulse signal for a second delay period shorter than the first delay period to generate a delayed stop pulse signal on a second delay output; and
   feed back the delayed stop pulse signal from the second delay output to the second delay input; and
a flip-flop circuit comprising:
   a data output;
   a data input coupled to the first delay output; and
   a clock input coupled to the second delay output;
wherein:

the time period comprises a time from a leading edge of the start pulse signal to a leading edge of the stop pulse signal;

the time increment comprises a second difference between the first delay period and the second delay period; and the integer number of the first time increment in the time period comprises a number of times the delayed start pulse signal iteratively propagates through the first delay feedback circuit and is clocked from the data input to the data output of the flip-flop circuit in response to the delayed stop pulse signal iteratively propagating through the second delay feedback circuit to the clock input.

3. The TDC circuit of claim 2, further comprising a counter circuit configured to:

increment a number of iterations each time the delayed stop pulse signal propagates through the second delay circuit in the second delay feedback circuit; and generate the integer number based on the number of iterations in response to the delayed stop pulse signal received at the clock input of the flip-flop circuit before the delayed start pulse signal received at the data input of the flip-flop circuit.

4. The TDC circuit of claim 3, further comprising:
a first remainder output; and
a second remainder output,
wherein:
the time remainder is generated, in response to generating the integer number, based on a time from the delayed stop pulse signal received at the clock input of the flip-flop circuit to the delayed start pulse signal received at the data input of the flip-flop circuit; and
the time remainder is a time between a first remainder signal on the first remainder output and a second remainder signal on the second remainder output.

5. The TDC circuit of claim 2, further comprising a calibration circuit configured to, in a calibration mode:
receive a calibration pulse signal;
determine whether a first number of iterations of the first delay period differs from a second number of iterations of the second delay period by more than an offset delay; and
adjust the second delay period in response to the first number of iterations of the first delay period differing from the second number of iterations of the second delay period by more than the offset delay.

6. The TDC circuit of claim 5, further comprising:
a first calibration counter configured to generate a first calibration pulse in response to counting the first number of iterations of the calibration pulse signal through the first delay circuit;
a second calibration counter configured to generate a second calibration pulse in response to counting the second number of iterations of the calibration pulse signal through the first second circuit; and
a comparison circuit configured to:
receive the first calibration pulse and the second calibration pulse; and
generate an adjustment signal to adjust the second delay period in response to the first calibration pulse and the second calibration pulse separated in time by more than the offset delay.

7. The TDC circuit of claim 2, the second measurement circuit comprising:
a first remainder input;
a second remainder input;

a time adder circuit configured to:
receive the time remainder from the first measurement circuit as a time between a first remainder signal on the first remainder input and a second remainder signal on the second remainder input;
add the time remainder to the previously accumulated remainder; and
generate the current accumulated remainder as a time between a first sum signal on a first adder output and a second sum signal on a second adder output;
an analog to digital converter (ADC) circuit configured to:
couple to the first adder output and the second adder output; and
generate the fractional indicator indicating whether a magnitude of the current accumulated remainder is greater than the half of the first time increment; and
a digital-to-analog converter (DAC) circuit configured to:
couple to the first adder output and the second adder output;
in response to the fractional indicator indicating the magnitude of the current accumulated remainder is greater than half of the first time increment, delay the first sum signal by one of the first delay period and the second delay period, and delay the second sum signal by an other one of the first delay period and the second delay period; and
in response to the fractional indicator indicating the magnitude of the current accumulated remainder is less than half of the first time increment, delay both of the first sum signal and the second sum signal by a same one of the first delay period and the second delay period.

8. The TDC circuit of claim 7, wherein the fractional indicator indicates a polarity of the current accumulated remainder.

9. The TDC circuit of claim 7, the time adder circuit comprising:
a first capacitor, a second capacitor, and a discharge circuit,
wherein:
the time adder circuit configured to add the time remainder to the previously accumulated remainder comprises the discharge circuit configured to:
discharge the first capacitor for a time equal to the time remainder to reduce a first voltage on the first capacitor from a supply voltage to a reduced first voltage;
in response to the previously accumulated remainder comprising a positive value, further discharge the first capacitor for a time equal to the previously accumulated remainder to further reduce the reduced first voltage; and
in response to the previously accumulated remainder comprising a negative value, discharge the second capacitor for a time equal to the previously accumulated remainder to reduce a second voltage on the second capacitor from the supply voltage to a reduced second voltage; and
determine the current accumulated remainder based on a voltage difference between the reduced first voltage and the reduced second voltage.

10. The TDC circuit of claim 9, wherein:
the discharge circuit is further configured to discharge the first capacitor from the reduced first voltage and discharge the second capacitor from the reduced second voltage;

activate a first sum flip-flop to generate the first sum signal in response to the first voltage on the first capacitor having a threshold voltage; and
activate a second sum flip-flop to generate the second sum signal in response to the second voltage on the second capacitor having the threshold voltage.

11. The TDC circuit of claim 7, the ADC circuit comprising:
a third delay circuit configured to delay the first sum signal by the first delay period to generate a delayed first sum signal;
a fourth delay circuit configured to delay the second sum signal by a third delay period to generate a delayed second sum signal; and
a second flip-flop circuit comprising:
a second data input configured to receive the delayed first sum signal;
a second clock input configured to receive the delayed second sum signal; and
a second data output,
wherein:
the first delay period and the third delay period differ by half of the first time increment;
the delayed first sum signal is propagated to the second data output in response to the current accumulated remainder being greater than a difference between the first delay period and the third delay period; and
one bit of the fractional indicator is generated on the second data output of the second flip-flop circuit.

12. The TDC circuit of claim 7, the DAC circuit comprising:
a fifth delay circuit configured to delay the first sum signal by the first delay period to generate a first delayed first sum signal;
a sixth delay circuit configured to delay the first sum signal by the second delay period to generate a second delayed first sum signal;
a first multiplexor configured to select, based on the fractional indicator, the first delayed first sum signal or the second delayed first sum signal to propagate to a first multiplexor output;
a seventh delay circuit configured to delay the second sum signal by the first delay period to generate a first delayed second sum signal;
an eighth delay circuit configured to delay the second sum signal by the second delay period generate a second delayed second sum signal;
a second multiplexor configured to select, based on the fractional indicator, the first delayed second sum signal or the second delayed second sum signal to propagate to a second multiplexor output; and
generate the next accumulated remainder based on a selected one of the first delayed first sum signal and the second delayed first sum signal on the first multiplexor output and on a selected one of the first delayed second sum signal and the second delayed second sum signal on the second multiplexor output.

13. The TDC circuit of claim 2, wherein the first time increment is less than 5% of the first delay period.

14. The TDC circuit of claim 1, wherein the integer number is generated as a multi-bit binary value and the fractional indicator is generated as a two-bit binary value.

15. The TDC circuit of claim 1 integrated into an integrated circuit (IC).

16. A method of a time-to-digital circuit (TDC), the method comprising:

receiving a start pulse signal and a stop pulse signal separated in time by a time period;
determining an integer number of a first time increment and a time remainder smaller than the first time increment within the time period;
adding the time remainder to a previously accumulated remainder to generate a current accumulated remainder;
generating a fractional indicator indicating whether the current accumulated remainder differs from the first time increment by more than half of the first time increment;
in response the fractional indicator indicating the current accumulated remainder differs from the first time increment by more than half of the first time increment, generating a next accumulated remainder comprising a difference between the first time increment and the current accumulated remainder; and
in response the fractional indicator indicating the current accumulated remainder differs from the first time increment by less than half of the first time increment, generating the next accumulated remainder based on the current accumulated remainder.

17. The method of claim 16, further comprising:
receive the start pulse signal at a first delay input of a first delay circuit;
delay the start pulse signal for a first delay period to generate a delayed start pulse signal on a first delay output of the first delay circuit;
feedback the delayed start pulse signal from the first delay output to the first delay input;
receive the stop pulse signal at a second delay input of a second delay circuit;
delay the stop pulse signal for a second delay period shorter than the first delay period to generate a delayed stop pulse signal on a second delay output of the second delay circuit;
feedback the delayed stop pulse signal from the second delay output to the second delay input;
receive the delayed start pulse signal at a data input of a flip-flop circuit; and
receive the delayed stop pulse signal at a clock input of the flip-flop circuit;
wherein:
the time period comprises a time from a beginning of the start pulse to a beginning of the stop pulse signal;
the time increment comprises a difference between the first delay period and the second delay period; and
the integer number of the first time increment in the time period comprises a number of times the delayed start pulse signal iteratively propagates through the first delay circuit and to a data output of the flip-flop circuit in response to the delayed stop pulse signal iteratively propagating through the second delay circuit to the clock input.

18. The method of claim 17, further comprising, in a calibration mode:
receiving a calibration pulse signal;
determining whether a first number of iterations of the first delay period differs from a second number of iterations of the second delay period by more than an offset delay; and
adjusting the second delay period in response to the first number of iterations of the first delay period differing from the second number of iterations of the second delay period by more than the offset delay.

19. The method of claim 17, further comprising:
receiving the time remainder as a time from a first remainder signal to a second remainder signal;
adding the time remainder to the previous accumulated remainder;
generating the current accumulated remainder as a time from a first sum signal to a second sum signal;
generating the fractional indicator indicating whether a magnitude of the current accumulated remainder is greater than the half of the first time increment based on the current accumulated remainder;
in response to the fractional indicator indicating the magnitude of the current accumulated remainder is greater than half of the first time increment, delaying the first sum signal by one of the first delay period and the second delay period, and delaying the second sum signal by an other one of the first delay period and the second delay period; and
in response to the fractional indicator indicating the magnitude of the current accumulated remainder is less than half of the first time increment, delay both of the first sum signal and the second sum signal by a same one of the first delay period and the second delay period.

20. The method of claim 19, further comprising:
adding the time remainder to the previously accumulated remainder comprises:
discharging a first capacitor for a time equal to the time remainder to reduce a first voltage on the first capacitor from a supply voltage to a reduced first voltage;
in response to the previously accumulated remainder comprising a positive sign, further discharging the first capacitor for a time equal to the previously accumulated remainder to further reduce the reduced first voltage; and
in response to the previously accumulated remainder comprising a negative sign, discharging a second capacitor for a time equal to the previously accumulated remainder to reduce a second voltage on the second capacitor from the supply voltage to a reduced second voltage; and
determining the current accumulated remainder based on a voltage difference between the reduced first voltage and the reduced second voltage.

21. A phase-locked loop (PLL) circuit comprising:
a digitally controlled oscillator (DCO);
a loop filter circuit;
a divider circuit; and
a time-to-digital (TDC) system, comprising:
 a coarse TDC circuit;
 a fine TDC circuit, comprising:
  a first measurement circuit configured to:
   receive a start pulse signal and a stop pulse signal separated in time by a time period;
   determine an integer number of consecutive first time increments in the time period; and
   determine a time remainder of the time period smaller than one of the first time increments; and
  a second measurement circuit configured to:
   add the time remainder to a previously accumulated remainder to generate a current accumulated remainder;
   generate a fractional indicator indicating whether a magnitude of the current accumulated remainder is greater than half of the first time increment;
   in response to the fractional indicator indicating the magnitude of the current accumulated remainder is greater than half of the first time increment, generate a next accumulated remainder comprising a difference between the first time increment and the current accumulated remainder; and
   in response to the fractional indicator indicating the magnitude of the current accumulated remainder is less than half of the first time increment, generate the next accumulated remainder comprising the current accumulated remainder; and
 a range determination circuit configured to:
  determine whether the time period is within a time period range;
  in response to determining the time period is greater than a maximum time period in the time period range, generate the integer number corresponding to the time period in the coarse TDC circuit; and
  in response to determining the time period is within the time period range, generate the integer number corresponding to the time period in the fine TDC.

* * * * *